(12) United States Patent
Stoeger et al.

(10) Patent No.: US 9,982,916 B2
(45) Date of Patent: May 29, 2018

(54) DEVICE FOR THE CONCENTRATION OF SOLAR RADIATION, COMPRISING AN INFLATABLE CONCENTRATOR CUSHION

(71) Applicant: HELIOVIS AG, Wiener Neudorf (AT)

(72) Inventors: Elmar Stoeger, Wiener Neudorf (AT); Felix Tiefenbacher, Wiener Neudorf (AT)

(73) Assignee: HELIOVIS AG, Wiener Neudorf (AT)

( * ) Notice: Subject to any disclaimer, the term of this patent is extended or adjusted under 35 U.S.C. 154(b) by 0 days. days.

(21) Appl. No.: 15/523,243

(22) PCT Filed: Oct. 30, 2015

(86) PCT No.: PCT/EP2015/075197
§ 371 (c)(1),
(2) Date: Apr. 28, 2017

(87) PCT Pub. No.: WO2016/066781
PCT Pub. Date: May 6, 2016

(65) Prior Publication Data
US 2017/0321932 A1 Nov. 9, 2017

(30) Foreign Application Priority Data

Oct. 31, 2014 (EP) .................................. 14191252

(51) Int. Cl.
*F24J 2/14* (2006.01)
*F24J 2/52* (2006.01)
(Continued)

(52) U.S. Cl.
CPC .............. *F24J 2/145* (2013.01); *F24J 2/055* (2013.01); *F24J 2/36* (2013.01); *F24J 2/4636* (2013.01);
(Continued)

(58) Field of Classification Search
CPC .. F24J 2/145; F24J 2/5271; F24J 2/541; F24J 2/055; F24J 2/36
(Continued)

(56) References Cited

U.S. PATENT DOCUMENTS 4,051,834 A * 10/1977 Fletcher .................. F24J 2/145
126/600
4,136,671 A * 1/1979 Whiteford ................ F24J 2/145
126/654

(Continued)

FOREIGN PATENT DOCUMENTS

CH  704394 A2  7/2012
ES  2446890 A1  3/2014
(Continued)

OTHER PUBLICATIONS

International Bureau of WIPO, International Preliminary Report on Patentability Issued in Application No. PCT/EP2015/075197, dated May 11, 2017, WIPO, 7 pages.
(Continued)

*Primary Examiner* — Ricky D Shafer
(74) *Attorney, Agent, or Firm* — McCoy Russell LLP

(57) ABSTRACT

The invention relates to a device for the concentration of solar radiation in an absorber, comprising an inflatable concentrator cushion, which comprises a cover film element comprising a light-permeable entry window for coupling in solar radiation and a reflector film, which sub-divides the concentrator cushion into at least two hollow spaces, for the concentration of solar radiation in an absorber, comprising a pivoting apparatus, by means of which the concentrator cushion can be pivoted, in particular about its longitudinal axis, and comprising a retaining apparatus secured (mounted) to the pivoting apparatus for retaining the concentrator cushion, which retaining apparatus comprising an upper longitudinal member extending in the longitudinal (Continued)

direction of the concentrator cushion, suspending the absorber, wherein the upper longitudinal member is arranged on a substantially air-tight closed upper passage opening of the concentrator cushion.

18 Claims, 16 Drawing Sheets

(51) Int. Cl.
| | |
|---|---|
| F24J 2/54 | (2006.01) |
| F24J 2/05 | (2006.01) |
| F24J 2/36 | (2006.01) |
| F24J 2/46 | (2006.01) |
| G02B 19/00 | (2006.01) |
| H01L 31/054 | (2014.01) |

(52) U.S. Cl.
CPC .......... *F24J 2/5233* (2013.01); *F24J 2/5271* (2013.01); *F24J 2/541* (2013.01); *G02B 19/0042* (2013.01); *H01L 31/0547* (2014.12)

(58) Field of Classification Search
USPC .......................................... 359/853; 126/697
See application file for complete search history.

(56) References Cited

U.S. PATENT DOCUMENTS

| | | | | |
|---|---|---|---|---|
| 4,432,342 | A * | 2/1984 | Lucas | F24J 2/145 126/570 |
| 6,994,082 | B2 * | 2/2006 | Hochberg | F24J 2/145 126/694 |
| 8,443,615 | B2 * | 5/2013 | King | F24J 2/0015 62/115 |
| 2010/0065045 | A1 | 3/2010 | Jennings | |
| 2010/0186733 | A1 * | 7/2010 | Hoefler | F24J 2/055 126/625 |
| 2010/0229850 | A1 | 9/2010 | Sankrithi | |
| 2011/0100358 | A1 | 5/2011 | Perisho | |
| 2011/0114083 | A1 * | 5/2011 | Pedretti | F24J 2/145 126/657 |
| 2011/0277815 | A1 | 11/2011 | Sankrithi | |
| 2012/0324888 | A1 * | 12/2012 | Tiefenbacher | F24J 2/125 60/641.15 |
| 2014/0071439 | A1 * | 3/2014 | Pedretti-Rodi | F24J 2/145 356/124 |
| 2017/0314816 | A1 * | 11/2017 | Binder | F24J 2/14 |
| 2017/0314818 | A1 * | 11/2017 | Stoeger | F24J 2/36 |
| 2017/0336100 | A1 * | 11/2017 | Stoeger | F24J 2/145 |
| 2017/0343243 | A1 * | 11/2017 | Stoeger | F24J 2/145 |

FOREIGN PATENT DOCUMENTS

| | | |
|---|---|---|
| WO | 2009117840 A2 | 10/2009 |
| WO | 2011106811 A2 | 9/2011 |
| WO | 2012006255 A2 | 1/2012 |
| WO | 2012083321 A1 | 6/2012 |
| WO | 2012145774 A2 | 11/2012 |
| WO | 2013074790 A1 | 5/2013 |

OTHER PUBLICATIONS

ISA European Patent Office, International Search Report Issued in Application No. PCT/EP2015/075206, dated Dec. 15, 2015, WIPO, 6 pages.

ISA European Patent Office, International Search Report Issued in Application No. PCT/AT2015/050275, dated Feb. 11, 2016, WIPO, 4 pages.

ISA European Patent Office, International Search Report Issued in Application No. PCT/EP2015/075198, dated Mar. 7, 2016, WIPO, 6 pages.

ISA European Patent Office, International Search Report Issued in Application No. PCT/EP2015/075197, dated Mar. 23, 2016, WIPO, 6 pages.

Stoeger, Elmar et al., "Device for the Concentration of Solar Radiation, Comprising an Inflatable Concentrator Cushion," U.S. Appl. No. 15/523,278, filed Apr. 28, 2017, 45 pages.

Binder, Leopold et al., "Apparatus for Concentrating Solar Radiation with Inflatable Concentrator Cushion," U.S. Appl. No. 15/523,133, filed Apr. 28, 2017, 45 pages.

Stoeger, Elmar et al., "Device for Anchoring an Inflatable Concentrator Cushion," U.S. Appl. No. 15/523,320, filed Apr. 28, 2017, 23 pages.

* cited by examiner

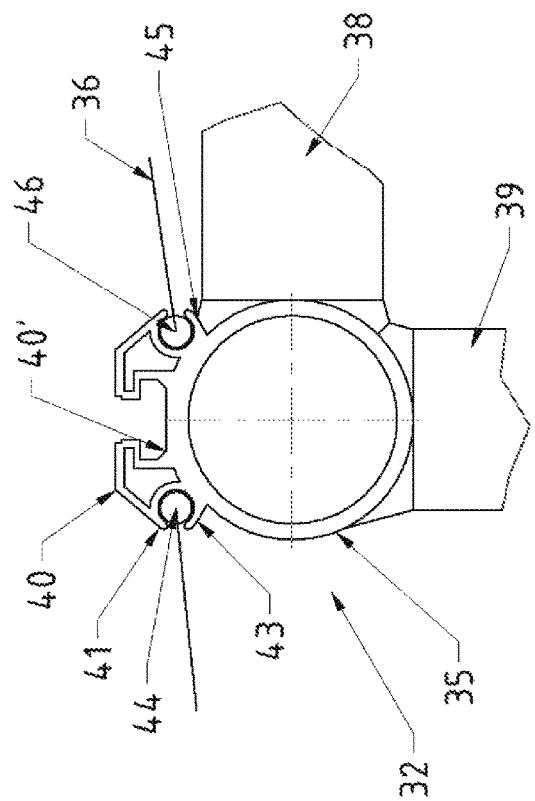
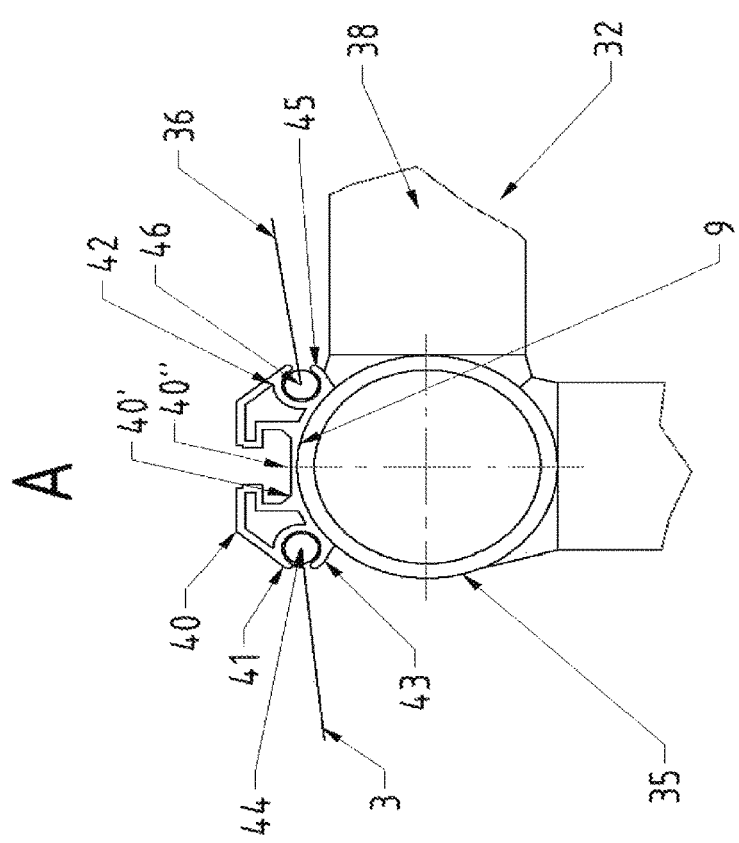
Fig. 6B
Fig. 6A

DEVICE FOR THE CONCENTRATION OF SOLAR RADIATION, COMPRISING AN INFLATABLE CONCENTRATOR CUSHION

CROSS-REFERENCE TO RELATED APPLICATIONS

The present application is a U.S. National Phase of International Patent Application Serial No. PCT/EP2015/075197, entitled "DEVICE FOR THE CONCENTRATION OF SOLAR RADIATION, COMPRISING AN INFLATABLE CONCENTRATOR CUSHION," filed on Oct. 30, 2015. International Patent Application Serial No. PCT/EP2015/075197 claims priority to European Patent Application No. 14191252.7, filed on Oct. 31, 2014. The entire contents of each of the above-cited applications are hereby incorporated by reference for all purposes.

TECHNICAL FIELD

A generic device for the concentration of solar radiation in an absorber has become known from WO 2012/145774. The device has an inflatable concentrator, which is formed by an elongated, substantially cylindrical tubular sleeve of a plurality of film elements. On the top side, the cushion has a transparent entry window for the solar radiation to pass through. Provision is further made for a reflector film, by means of which the cushion is sub-divided into at least two separate pressure chambers. The reflector film has a reflecting surface, by means of which the coupled-in solar radiation is focused in the direction of an absorber. For anchoring the concentrator, provision is made for an anchoring frame. The anchoring frame has a tracking system consisting of a plurality of tracking rings, so that the cushion-shaped concentrator can track the sun's path. In the case of the known embodiment, the absorber is suspended on the anchoring frame by means of an elongated absorber suspension. The absorber suspension passes through a securing opening of the concentrator cushion in the area of the entry window. To prevent air from escaping from the concentrator cushion, the securing opening is sealed on all sides.

BACKGROUND AND SUMMARY

For this purpose, provision was made for a keder system, in the case of which sections of the concentrator cushion adjoining the securing opening are wrapped around a keder and are fixed by means of clamping plates of the absorber suspension, which are arranged on the concentrator cushion on the inner and outer side. In the area of the securing opening, the concentrator cushion is thus fixedly connected to the absorber suspension, wherein forces acting on the concentrator cushion are removed via the absorber suspension. On principle, this embodiment turned out to be very advantageous for retaining the concentrator cushion in the desired position. However, long-term tests revealed that the efficiency of the energy conversion decreased over time during operation of the concentrator cushion.

Other reflectors or concentrators, respectively, are described in WO 2012/083321 A1, CH 704 394 A2, US 2010/229850 A1, US 2011/277815 A1 and WO 2013/074790 A1.

In contrast, it is the object of the invention at hand to eliminate or to ease, respectively, the disadvantages of the prior art. The invention thus in particular has the goal of creating a device of the above-specified type, by means of which the efficiency of the concentrator cushion can be maintained for the most part during continuous operation.

This object is solved by means of a device comprising the features of claim 1. Preferred embodiments are specified in the dependent claims.

According to the invention, provision is made between the upper longitudinal member of the retaining apparatus and the pivoting apparatus for an adjusting device, by means of which the distance between the upper longitudinal member and the pivoting apparatus can be adjusted.

The efficiency of the elongated concentrator cushion, which preferably has a substantially cylindrical cross section, is influenced by a variety of factors, which additionally overlap in a complex manner. Surprisingly, however, extensive tests showed that the efficiency of the concentrator cushion can be largely maintained in response to continuous use, if a height adjustment of the upper longitudinal member, based on the operating position thereof, is made. It was observed that the (plastic) materials of the concentrator cushion tend to creep. This relates in particular to the plastic material of the cover film element, which is preferably made of ethylene tetrafluoroethylene (ETFE). The creeping of the plastic material has an impact on the force transmission between the cover film element of the concentrator cushion and the upper longitudinal member, wherein a force component is caused in the vertical direction on the upper longitudinal member, which causes a bulge of the upper longitudinal member. The absorber suspended on the upper longitudinal member in the upper hollow space of the concentrator cushion is thus arranged at least partially outside of the focus area of the reflector film. This has a disadvantageous effect on the efficiency of the energy conversion. Due to the manual or automatic adjustment of the upper longitudinal member with respect to the pivoting apparatus, the substantially horizontal orientation of the upper longitudinal member can be permanently ensured. The absorber can thus be arranged reliably in the focus of the curved reflector film between the pressure chambers of the concentrator cushion, even if the plastic material of the cover film element is subjected to an aging or creeping process, respectively. The adjusting device can be assembled between the pivoting apparatus and the retaining apparatus with little effort, so that the production effort is barely increased through this. According to this, the efficiency of the concentrator cushion can be increased in a significantly more cost-efficient manner than with other measures, such as the use of stiffer retaining apparatuses, by means of the arrangement of the adjusting device. The production costs can thus be kept particularly low.

According to a particularly preferred embodiment, the upper longitudinal member comprises at least two longitudinal belts, which extend in the longitudinal direction of the concentrator cushion and which are in particular connected to one another via filling bars (cross bars), which longitudinal belts are in each case connected to a longitudinal edge of the cover film element, which longitudinal edge delimits the upper passage opening, wherein the adjusting device is connected to one of the longitudinal belts of the upper longitudinal member, preferably to both longitudinal belts of the upper longitudinal member. As in the case of the prior art of WO 2012/145774, the retaining apparatus passes through a passage opening, which is sealed on all sides, of the concentrator cushion, wherein the absorber is suspended on the upper longitudinal member of the retaining apparatus in the upper hollow space of the concentrator cushion. In contrast to this, however, the longitudinal member according to the invention has at least two elongated longitudinal belts, which, based on the circumferential direction of the concentrator cushion, are arranged at a distance to one another. Provision is preferably made between the longitudinal belts for a sealing film strip, which bridges the upper passage opening of the concentrator cushion. In this embodiment, the longitudinal belts are connected to the longitudinal edges of the cover film element, the longitudinal edges adjoining the upper passage opening, in a substantially air-tight manner on the one hand. On the other hand, the longitudinal belts are connected in a substantially air-tight manner to the lateral edge areas of the sealing film strip, which extends between the longitudinal belts, preferably substantially across the entire width of the passage opening. To form the longitudinal belts, provision is preferably made for beam elements, which in particular have a substantially circular cross section. Due to the arrangement of the sealing film strip, the passage opening between the longitudinal belts of the upper longitudinal member is closed in a substantially air-tight manner, so that the connection between the longitudinal belts of the upper longitudinal member itself does not need to be embodied in an air-tight manner. In contrast to the prior art, the embodiment has a number of advantages. It is initially significant that the embodiment of the upper longitudinal member with two longitudinal belts is set up for two connections between the longitudinal member and the concentrator cushion. The forces acting on the concentrator cushion during operation, for example wind forces, can thus be absorbed particularly efficiently. It is in particular advantageous that the cushion-shaped or tubular concentrator, respectively, can be kept largely free from deformations during operation. The concave curvature of the reflector film between the upper and the lower hollow space of the concentrator can thus be accurately maintained, so that the solar radiation is focused on the absorber with a high efficiency. To absorb operating loads, it is particularly advantageous, if the longitudinal belts represent the outer longitudinal edges of the upper longitudinal member, so that the width of the upper longitudinal member substantially corresponds to the width of the passage opening. Due to the favorable force application in the upper longitudinal member, a weight-reducing can also be attained, wherein in particular the clamping plates provided in the prior art for clamping the keders can be forgone. The sealing film strip between the opposite longitudinal edges of the cover film element further has the advantage that the passage opening can be reliably closed in a substantially air-tight manner, wherein the embodiment as film element, i.e. as flexible element in particular of a plastic material, effects a weight reduction. It is furthermore particularly advantageous that the sealing film strip is optimally suitable for the entry of the solar radiation into the concentrator, wherein the sealing film strip is preferably present in a tensioned state, which is curved outwardly, due to the pressure in the upper hollow space.

To fix the upper longitudinal member to the pivoting apparatus so as to be height-adjustable, it is advantageous if the adjusting device is connected to one of the longitudinal belts of the upper longitudinal member, preferably to both longitudinal belts of the upper longitudinal member.

To increase the efficiency of the concentrator, it is advantageous, if the sealing film strip consists of a transparent plastic material, in particular of ethylene tetrafluoroethylene (ETFE). The sealing film strip thus preferably continues the transparent entry window of the cover film element, which extends on both sides of the upper passage opening of the concentrator cushion, substantially without interruptions. In this way, solar radiation can reach through the sealing film strip to the absorber, which is suspended on the upper longitudinal member in the upper hollow space of the concentrator cushion. The cover film element with the entry window and the sealing film strips are preferably made from the same material. The efficiency for the conversion of the solar energy can thus be increased.

To increase the stability of the upper longitudinal member, it is advantageous, if the upper longitudinal member has at least two further longitudinal belts, which extend parallel to the longitudinal belts in the longitudinal direction of the concentrator cushion. The upper longitudinal member preferably has a substantially rectangular, in particular substantially square, cross section, wherein the upper corners are formed by the longitudinal belts and the lower corners are formed by the further longitudinal belts. For the purpose of this disclosure, the terms "top" and "bottom" always refer to the operating position of the device.

To attain a maximum volume of the concentrator cushion inside the pivoting apparatus, it is advantageous, if the further longitudinal belts of the upper longitudinal member are arranged inside the upper hollow space of the concentrator cushion. In the case of this embodiment, the longitudinal belts preferably extend in the plane of the cover film element, whereas the further longitudinal belts are arranged in the upper hollow space of the concentrator cushion. Advantageously, the installation volume available inside the pivoting apparatus can thus be optimally used.

To embody the upper longitudinal member as lattice truss, it is favorable, if the longitudinal belts of the upper longitudinal member are connected to one another via filling bars (cross bars), wherein further filling bars are preferably provided between the longitudinal belts and the further longitudinal belts. Surprisingly, it turned out that the embodiment of the upper longitudinal member as lattice truss, which is known per se from the construction industry, provides particular advantages for the use according to the invention for the concentrator cushion. First of all, the longitudinal edges of the cover film element can be easily and reliably connected to the longitudinal belts of the lattice truss-like upper longitudinal member in a substantially air-tight manner. Secondly, the sunlight can enter into the concentrator cushion between the longitudinal belts and the filling bars, whereby the available light quantity for the focusing in the absorber is increased. Thirdly, such lattice trusses are available cost-efficiently in a variety of dimensions, whereby the production costs for the concentrator can be reduced. Fourthly, the design of the upper longitudinal member as lattice truss provides for an optimum reinforcement of the concentrator cushion in its longitudinal direction, whereby the impacts of external influences on the geometry of the concentrator cushion, in particular on the concave curvature of the reflector film, can be kept low.

To connect the concentrator cushion to the upper longitudinal member, it is favorable, if a profile element is in each case arranged on the longitudinal belts of the upper longitudinal member, which profile element is connected on the one side to a connecting element for the substantially air-tight connection to one of the longitudinal edges of the cover film element and, on the other side, to a further connecting element for the substantially air-tight connection to one of the longitudinal edges of the sealing film strip. The profile elements are preferably provided on the upper sides of the longitudinal belts, wherein the connecting elements extend in the longitudinal direction of the longitudinal belts.

With regard to a stable, cost-efficient embodiment, it is advantageous, if the profile elements are designed in one piece with the longitudinal belts of the upper longitudinal member. In the case of this embodiment, the profile elements are thus integrated in the upper longitudinal member. According to a less preferred embodiment, the profile elements are present as separate components, which are secured to the longitudinal belts.

To seal the connection between the upper longitudinal member and the concentrator cushion, it is favorable, if a keder rail is provided as connecting element, in which a keder element is arranged on one of the longitudinal edges of the cover film element. In the case of this embodiment, provision is thus made as sealant between the concentrator cushion and the upper longitudinal member for a keder apparatus, which is formed by the keder elements and the corresponding keder rails. The keder elements extend across the length of the longitudinal edges of the cover film element. Provision is made on the longitudinal belts of the upper longitudinal member for corresponding keder rails, which extend in the longitudinal direction of the upper longitudinal member and thus parallel to the longitudinal edges of the cover film element. The keder element has a larger cross section than the cover film element, wherein the keder element is preferably embodied with a round, in particular circular, cross section. Due to the pressure in the upper hollow space of the concentrator cushion, the cover film element is present in a tensioned state, so that the keder elements on the longitudinal edges of the cover film element are pushed against the inner walls of the keder rails. A substantially air-tight connection of the concentrator cushion to the upper longitudinal member is attained through this, which has proven to be particularly reliable.

To connect the sealing film strip in a substantially air-tight manner to the longitudinal belts of the upper longitudinal member in a corresponding way, it is favorable, if a further keder rail, in which a further keder element is arranged on one of the longitudinal edges of the sealing film strip, is provided as further connecting element. In the case of this embodiment, provision is made on the opposite longitudinal edges of each profile element for keder rails, which are preferably embodied substantially identically. According to this, each profile element is connected to the outside to one of the longitudinal edges of the cover film element and to the inside to one of the longitudinal edges of the sealing film strip.

According to an alternative embodiment of the sealant between the concentrator cushion and the upper longitudinal member, a clamping part is provided as connecting element for clamping one of the longitudinal edges of the cover film element and/or a further clamping part as further connecting element for clamping one of the longitudinal edges of the sealing film strip. In the case of this embodiment, the longitudinal edges of the cover film element adjacent to the upper passage opening for the longitudinal member are clamped between seats of the clamping part or of the profile element, respectively. By means of the clamping, the cover film element is connected to the longitudinal member in a substantially air-tight manner. The cover film strip between the longitudinal belts of the upper longitudinal member can accordingly be clamped to the longitudinal belts of the upper longitudinal member in a substantially air-tight manner by means of further clamping parts.

To design the assembly of the concentrator cushion to be particularly simple, it is advantageous, if the clamping part can be pivoted between a position, which releases the longitudinal edge of the cover film element, and a position, which clamps the longitudinal edge of the cover film element, and/or that the further clamping part can be pivoted between a position, which releases the longitudinal edge of the sealing film strip, and a position, which clamps the longitudinal edge of the sealing film strip. In the case of this embodiment, the clamping parts are pivotably supported, so that the concentrator cushion can be removed from the longitudinal member by pivoting the clamping parts into the released position. Vice versa, the clamping parts for the air-tight connection to the longitudinal member are pivoted into the clamped position, in which the longitudinal edges of the cover film element are fixedly clamped to the longitudinal belts of the longitudinal member against the seats on the profile elements. The connection between the further clamping parts and the sealing film strip can be established and released accordingly.

According to a further embodiment, provision is made for a zipper element as connecting element for the connection to a corresponding zipper element on one of the longitudinal edges of the cover film element and/or for a further zipper element as further connecting element for the connection to a corresponding further zipper element of the sealing film strip. In the case of this embodiment, the profile elements on the longitudinal belts are provided with zipper elements, which are in particular attached to narrow film strips. These zipper elements can be connected in a substantially air-tight manner to corresponding zipper elements, which are arranged on the longitudinal edges of the cover film element or of the sealing film strip, respectively.

To increase the stability of the connection between the upper longitudinal member and the pivoting apparatus, it is advantageous, if retaining elements for the in particular positive connection to corresponding retaining elements for the connection of the pivoting apparatus are provided on the longitudinal belts of the upper longitudinal member. According to this, the loads acting on the upper longitudinal member are transferred via the retaining elements on the longitudinal belts. Advantageously, a particularly good load absorption is thus attained, by means of which a deformation of the upper longitudinal member is prevented. The suspension of the absorber in the focus area of the reflector film can thus be accurately maintained even in the case of adverse environmental conditions. To form the retaining elements, the profile element has retaining openings, which preferably extend in the longitudinal direction of the concentrator cushion and in which the corresponding retaining elements are received for the connection of the pivoting apparatus. The retaining openings on the profile elements preferably extend in the longitudinal direction of the upper longitudinal member.

With regard to a cost-efficient embodiment with a simple design, it is advantageous, if the adjusting device for adjusting the distance between the upper longitudinal member and the pivoting apparatus comprises an adjusting element, in particular a threaded rod, which is in particular arranged substantially vertically to the longitudinal direction of the upper longitudinal member. The one end of the adjusting element is preferably connected to the pivoting apparatus and the other end of the adjusting element is connected to one of the longitudinal belts of the upper longitudinal member. For this purpose, the pivoting apparatus can have an angle element comprising a substantially horizontal securing flange, on which the one end of the adjusting element is arranged. The adjusting element is preferably embodied as threaded rod, which can be shifted in a retaining opening, in particular on the upper longitudinal member, and which can be fixed in the desired position by means of at least one threaded nut, for adjusting the distance between the pivoting apparatus and the upper longitudinal member.

According to an alternative preferred embodiment, at least one toggle lever element comprising two leg parts, which are connected to one another in an articulated manner, is arranged between the upper longitudinal member and the pivoting apparatus, wherein an opening angle between the leg parts of the toggle lever element for adjusting the distance between the pivoting apparatus and the upper longitudinal member can be changed. According to this, the toggle lever element is arranged so as to be pivotable between a first state comprising a smaller opening angle of the leg parts, in which the upper longitudinal member is spaced apart further away from the securing location on the pivoting apparatus, and a second state comprising a larger opening angle of the leg parts, in which the upper longitudinal member is arranged closer to the securing location on the pivoting apparatus. The toggle lever element is preferably set up for the substantially continuous adjustment between a maximum distance and a minimum distance between the upper longitudinal member and the pivoting apparatus. The toggle lever element is preferably connected to a locking element for fixing the toggle lever element with a certain opening angle.

To be able to adapt the distance between the upper longitudinal member and the pivoting apparatus in a simple manner, it is advantageous, if, for changing the opening angle, the at least one toggle lever element is coupled to an adjusting element, which is preferably arranged substantially parallel to the longitudinal direction of the upper longitudinal member. It is advantageous thereby that the adjustment can be made with little operating force. In the case of this embodiment, provision is preferably made for a translation between the adjustment of the adjusting element and the pivoting of the toggle lever element. As adjusting element, provision is preferably made for a threaded rod.

To guide the upper longitudinal member closer to the pivoting apparatus or to move it further away therefrom, it is advantageous, if two toggle lever elements, which are arranged on the longitudinal belts of the upper longitudinal member, are connected to one another via a connecting rod, with which preferably the adjusting element engages. According to this, toggle lever elements are provided on the opposite longitudinal belts, wherein a connecting rod extends between the toggle lever elements. The adjustment of the toggle lever elements can thus be coupled to one another, so that the distance between the upper longitudinal member and the pivoting apparatus can be changed to the same extent on both sides. For the disclosure at hand, the distance between the upper longitudinal member and the pivoting apparatus is defined as the shortest distance between the top side of the upper longitudinal member and the bottom side of the pivoting apparatus.

For the force transmission between the upper longitudinal member and the pivoting apparatus, it is advantageous, if two toggle lever elements, which are spaced apart in the longitudinal direction of the upper longitudinal member and which are preferably coupled to one another via the adjusting element, are secured to each longitudinal belt.

To prevent an undesired deformation of the upper longitudinal member during operation without involving the operating personnel, it is favorable, if the adjusting device has a drive element, by means of which the distance between the pivoting apparatus and the upper longitudinal member can be automatically readjusted as a function of a load state of the upper longitudinal member. In the case of this embodiment, the distance between the pivoting apparatus and the upper longitudinal member is thus automatically controlled during operation, in order to keep the upper longitudinal member substantially free from deformations between the securing locations on the pivoting apparatus. For this purpose, the drive element is set up to detect the load state of the upper longitudinal member, which is effected by the clamping of the concentrator cushion on the upper longitudinal member, i.e. in particular by the vertical force caused by the creeping of the concentrator cushion. Depending on the load state, the distance between the pivoting apparatus and the upper longitudinal member is automatically changed.

According to a particularly preferred embodiment, provision is made for a spring element as drive element, wherein the distance between the pivoting apparatus and the upper longitudinal member can be adjusted as a function of the load state of the upper longitudinal member against the force of the spring element. Due to the creeping of the plastic material next to the upper passage opening of the concentrator cushion, an additional force, in particular in the vertical direction, is exerted on the upper longitudinal member, which effects a compression of the spring element, wherein the upper longitudinal member is guided closer to the pivoting apparatus against the spring effect. A balance of forces is effected in this manner, which always keeps the upper longitudinal member at the optimal distance to the pivoting apparatus, so that it is reliably prevented that the longitudinal member bends open in its longitudinal direction. The absorber on the bottom side of the upper longitudinal member can thus be held accurately in the focus area of the reflector film or reflective film, respectively.

To make it possible for the concentrator cushion to track the sun's path, i.e. the current position of the sun above the location, it is favorable, if the pivoting apparatus comprises at least one pivoting element, in particular a pivoting ring, which surrounds the concentrator cushion in its circumferential direction, wherein the upper longitudinal member of the retaining apparatus is suspended on the pivoting element by means of the adjusting device. Such pivoting rings are known per se in the prior art, see, e.g., WO 2012/145774. The upper longitudinal member is preferably arranged on the inner side of the pivoting element, wherein the upper longitudinal member can be adjusted in height, i.e. in the vertical direction, by means of the adjusting device.

To transfer loads, for example wind loads, acting on the concentrator cushion, it is favorable if provision is made for a plurality of pivoting elements, in particular pivoting rings, which are spaced apart in the longitudinal direction of the concentrator cushion and to which the upper longitudinal member of the retaining apparatus for the absorber is secured, wherein provision is made in each case between the upper longitudinal member and the pivoting elements, in particular pivoting rings, for an adjusting device. According to this, the longitudinal member is secured to pivoting elements at defined intervals, wherein the concentrator cushion passes through the individual pivoting elements. The upper longitudinal member is preferably suspended on every pivoting element, wherein a corresponding number of adjusting devices is provided between the upper longitudinal member and the pivoting elements. The distances between the upper longitudinal member and the individual pivoting elements can thus be adjusted individually, so that the upper longitudinal member can be held in the desired, in particular substantially horizontal, linear orientation, in the focus range of the reflective film.

To absorb the loads acting on the concentrator cushion and to thus prevent undesired deformations of the concentrator cushion during operation, if possible, it is favorable, if a lower longitudinal member of the retaining apparatus is arranged on a substantially air-tight closed lower passage opening of the concentrator cushion, wherein provision is made between the lower longitudinal member of the retaining apparatus and the pivoting apparatus for a further adjusting device for adjusting the distance between the lower longitudinal member and the pivoting apparatus. According to this, the concentrator cushion in the case of this embodiment is attached to at least two, preferably exactly two, longitudinal members. In the case of this embodiment, provision is furthermore made for a further adjusting device for adjusting the distance between the lower longitudinal member and the pivoting apparatus, which can be embodied identically to the adjusting device between the upper longitudinal member and the pivoting apparatus. According to this, the above-described preferred embodiments of the adjusting device can accordingly refer to the further adjusting device between the lower longitudinal member and the pivoting apparatus.

In the case of this embodiment, it is in particular favorable, if the lower passage opening is provided on a bottom film element of the concentrator cushion, which bottom film element adjoins the lower hollow space. Advantageously, the concentrator cushion is thus fixed on its top side and on its bottom side, whereas the longitudinal sides of the concentrator cushion, in particular in the area of the longitudinal edges of the reflector film, are arranged so as to be expandable in the radial direction. A thermal expansion of the concentrator cushion in particular in the area of the reflector film can thus be released, whereby the concave geometry of the reflector film is accurately maintained for the focusing of the solar radiation in the absorber.

To secure the concentrator cushion to the retaining apparatus, it is particularly favorable, if the upper longitudinal member, which is connected to the cover film element, and the lower longitudinal member, which is connected to the bottom film element of the concentrator cushion, are embodied substantially identically. The upper longitudinal member and the lower longitudinal member are preferably embodied in the manner of lattice trusses, wherein the upper longitudinal member passes through the passage opening on the cover film element and the lower longitudinal member passes through the lower passage opening on the bottom film element.

To also ensure the geometry of the concentrator cushion and the arrangement of the absorber in the case of high external loads, the upper longitudinal member and/or the lower longitudinal member preferably extends at least across more than half of the length of the concentrator cushion, wherein the upper longitudinal member and/or the lower longitudinal member preferably extends between a front end piece and a rear end piece on the front sides of the concentrator cushion. It is thus particularly favorable, if the upper longitudinal member and the lower longitudinal member extend substantially across the entire length of the concentrator cushion. In the case of this embodiment, the longitudinal members preferably end adjacently to the end pieces of the concentrator cushion, by means of which the upper and lower hollow space of the concentrator cushion are closed in a substantially air-tight manner.

To anchor the pivoting apparatus on a bottom structure, provision is in particular made for an anchoring apparatus, which preferably comprises a suspension apparatus for suspending the pivoting apparatus. In the prior art of WO 2012/145774, provision is made for an anchoring frame for anchoring the concentrator. The anchoring frame has a tracking system, so that the cushion-shaped concentrator can track the sun's path. The tracking system consists of a plurality of tracking rings, which surround the concentrator cushion and which are rotatably supported by means of roller devices. The tracking rings are supported on bottom-side base elements. However, test runs showed that the tracking rings, which are supported on the bottom, are subjected to high tilting moments during operation, in particular due to wind loads. To withstand the loads during operation, the tracking rings thus had to be embodied so as to be comparatively massive. However, in the case of the previous embodiment, it was not possible to keep the external loads completely away from the tubular concentrator and the anchoring frame. Due to the external influences, deformation states of the concentrator were observed during operation. Such deformations, however, could shorten the service life of the concentrator or could cause damages, respectively. It is even more significant, however, that the influences on the geometry of the curved reflector film can lower the efficiency of the concentrator. The suspension for the absorber was furthermore not always held completely in the focus area of the reflector film. This also has a disadvantageous effect on the efficiency of the concentrator. To improve the absorption of external loads, in particular wind loads, it is favorable, if the anchoring apparatus has a suspension apparatus for suspending the pivoting apparatus. In contrast to the prior art, the pivoting apparatus and retaining apparatus for the concentrator cushion is thus no longer supported on the bottom from the underside, but is suspended on a suspension apparatus on the top side. According to this, the pivoting apparatus, to which the concentrator cushion is secured in the operating state, is supported substantially completely by the suspension apparatus. The pivoting apparatus is set up to pivot the concentrator cushion, preferably about its longitudinal axis. For the purposes of this disclosure, the suspension of the pivoting apparatus means that the securing locations between the suspension apparatus and the pivoting apparatus are arranged only above a plane, which has the center of mass of the pivoting apparatus. The terms "top" and "bottom" hereby refer to the operating position of the device. This embodiment in particular has the advantage that the external loads, such as wind forces, can be absorbed particularly efficiently and can be transferred to a foundation at the location. It is advantageous in particular that the cushion-shaped or tubular concentrator, respectively, can be kept largely free from external influences. The concave curvature of the reflector film between the upper and the lower pressure chamber of the concentrator can thus be accurately maintained, so that the solar radiation is focused on the absorber with a high efficiency. The embodiment according to the invention is further advantageous to the effect that the pivoting apparatus can be embodied so as to be slimmer than in the prior art. Material costs can thus be saved. The level of clouding of the reflector film is furthermore reduced, whereby the efficiency can be further increased.

For suspending the pivoting apparatus for the concentrator cushion, it is favorable, if the suspension apparatus comprises at least one support frame, preferably a plurality of support frames, which are arranged so as to be spaced apart in the longitudinal direction of the concentrator cushion, wherein the at least one support frame in each case comprises at least a first frame element on the one longitudinal side of the concentrator cushion and a second frame element on the other longitudinal side of the concentrator cushion. Advantageously, the support frame can be produced very well from standard profiles, which already leads to significant cost advantages in the case of small quantities.

To increase the stability of the suspension apparatus, it is advantageous, if the support frame comprises a third frame element above the concentrator cushion, which connects the first frame element on the one longitudinal side of the concentrator cushion to the second frame element on the other longitudinal side of the concentrator cushion. In the case of this embodiment, the support frame thus extends from the one longitudinal side of the concentrator cushion over the top side of the concentrator cushion to the other longitudinal side of the concentrator cushion, so that the concentrator cushion is arranged completely inside the support frame in the assembled operating state. The pivoting apparatus is preferably suspended on the bottom side of the support frame. According to this, the pivoting apparatus is preferably framed substantially completely by the support frame. This embodiment turned out to be particularly favorable for absorbing the forces, for example wind forces, which appear during operation.

For the concentrator cushion to track the sun's path, it is advantageous, if provision is made between the suspension apparatus and the pivoting apparatus for a pivot bearing apparatus, in particular a roller bearing. Such roller bearings are known per se in the prior art, see, e.g., WO 2012/145774. The roller bearing has roller elements, which are in particular provided on a travelling crane. The roller elements are connected to a drive, wherein, in the driven state, the roller elements generate a torque, which effects a pivoting of the pivoting apparatus with the concentrator cushion about an axis, in particular about the longitudinal axis of the concentrator cushion, as a result of a frictional connection in response to the rolling on the pivoting apparatus.

The invention will be explained in more detail below by means of exemplary embodiments, which are illustrated in the drawing, but to which the invention is not to be limited.

BRIEF DESCRIPTION OF THE FIGURES

FIG. 6A shows the detail A, which is illustrated in FIG. 5 by means of a circle;

FIG. 6B shows a detailed view, which corresponds to FIG. 6A, comprising an alternative embodiment of the upper longitudinal member;

DETAILED DESCRIPTION

Figure 1A:
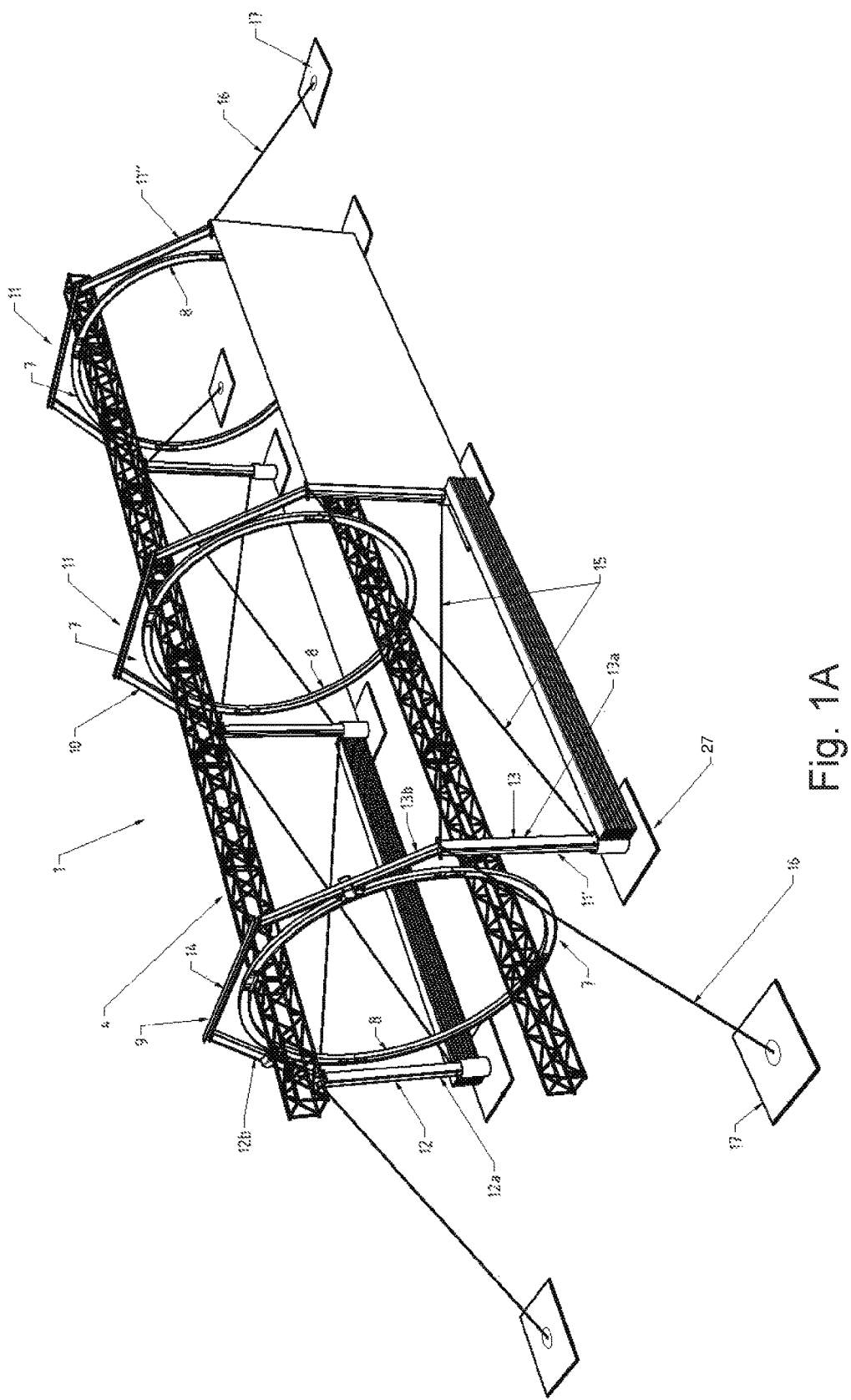
FIG. 1A shows a figurative view of a device according to the invention for the concentration of solar radiation in an absorber (see FIG. 2), in the case of which a plurality of pivoting rings for pivoting a concentrator cushion (see FIGS. 1B, 1C and FIG. 2) are suspended on a support frame.
Figure 1B:
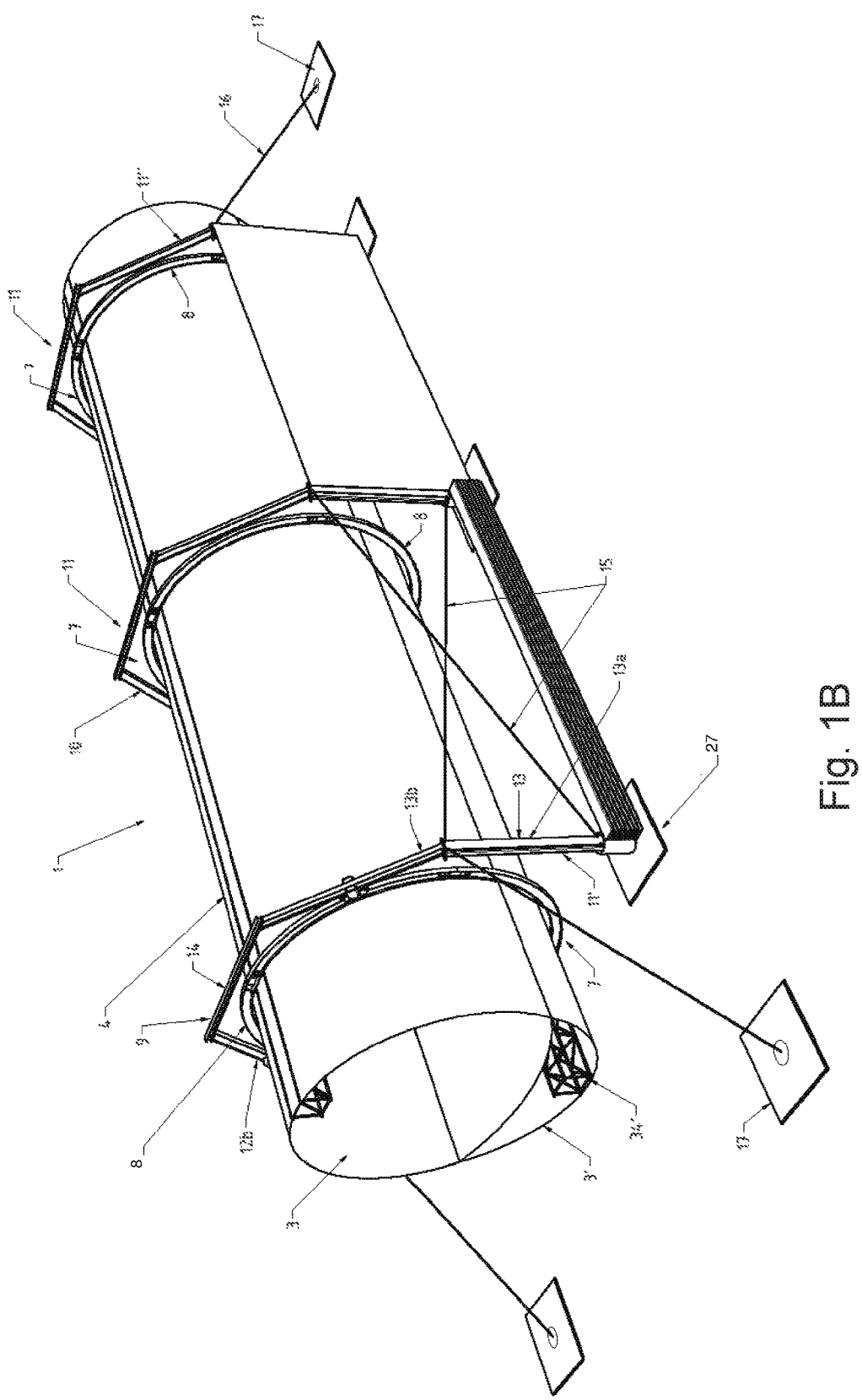
FIG. 1B shows a further figurative view of the device according to the invention according to FIG. 1A, wherein the concentrator cushion (without the end pieces thereof) can additionally be seen.
Figure 1C:
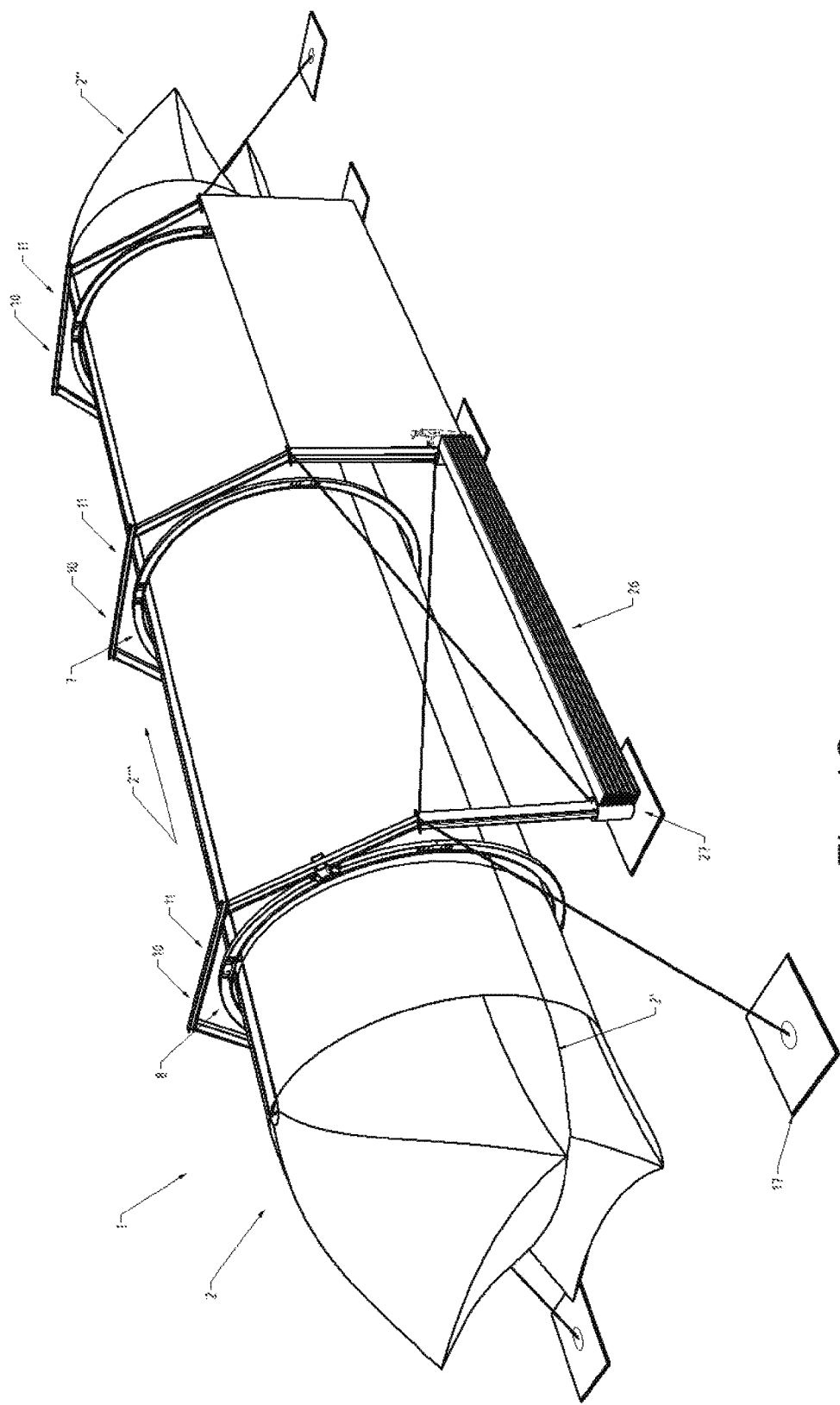
FIG. 1C shows a further figurative view of the device according to the invention according to FIG. 1B, wherein the concentrator cushion can be seen in the operating state, including the end pieces thereof.
Figure 2:
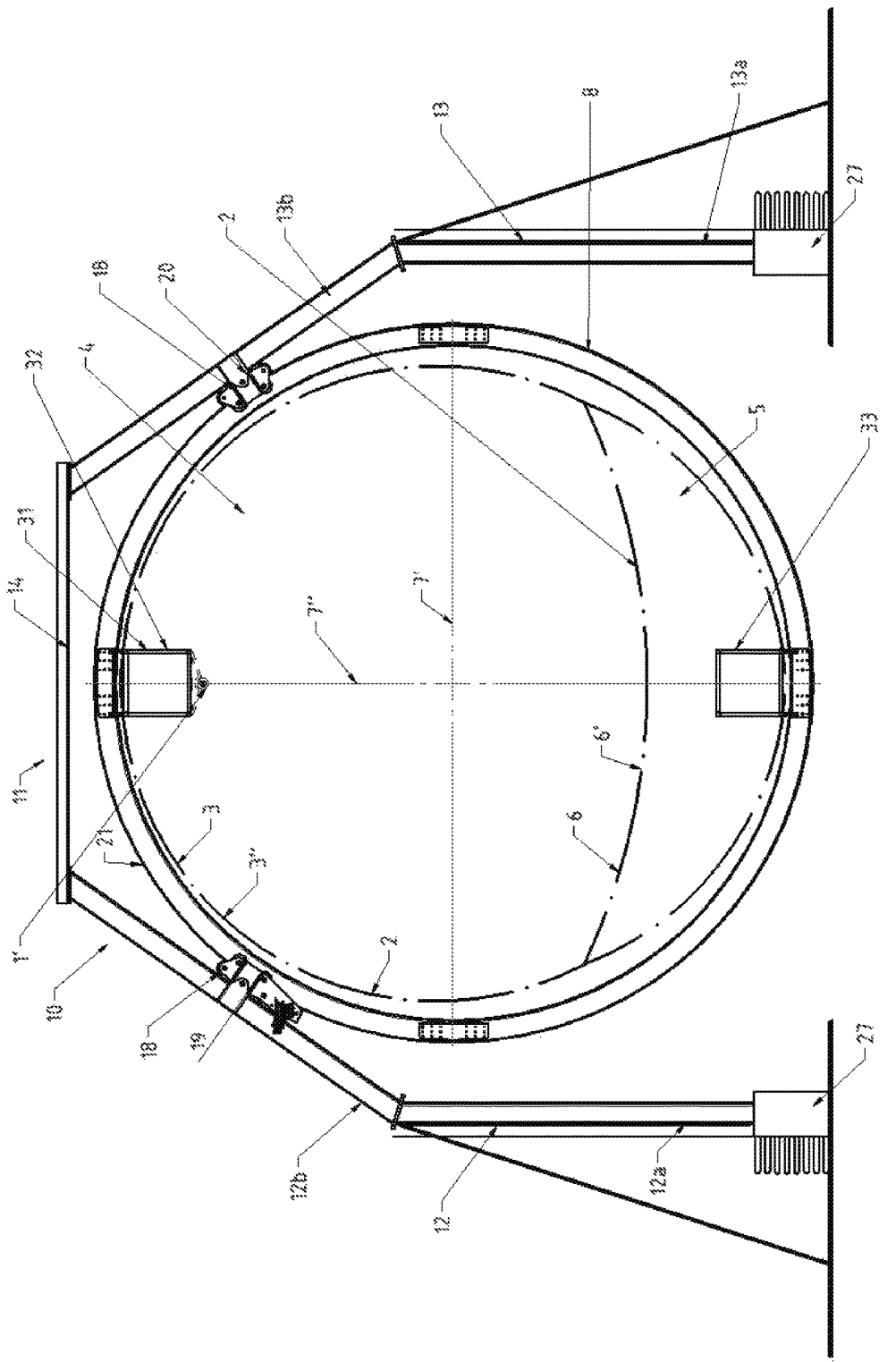
FIG. 2 shows a cross sectional view of the device according to FIGS. 1A, 1B, and 1C, wherein the concentrator cushion can be seen in the assembled state.

FIGS. 1A to 1C show a device 1 for the concentration of solar radiation in an absorber 1' (see FIG. 2). The device 1 has an inflatable concentrator cushion 2 (see FIG. 1C and FIG. 2). The concentrator cushion 2 has a cover film element 3" comprising a light-permeable entry window 3 for coupling in solar radiation and a reflector film 6, which is curved in the operating state and which sub-divides the concentrator cushion 2 into at least two hollow spaces 4, 5, for the concentration of solar radiation in an absorber 1'. The reflector film 6 has a reflecting surface 6', which focuses the coupled-in solar radiation in the direction of the absorber 1'. The absorber 1', which is to also be understood as a solar panel, is located in the focus area of the reflecting surface 6' inside the upper hollow space 4, which connects to the entry window 3, of the concentrator cushion 2. In particular a pipe, through which a medium flows, or a photovoltaic element can be provided as absorber 1'. The concentrator can thus be used for concentrated photovoltaics (CPV=concentrated photovoltaics) as well as for thermal concentrated solar power (CSP=thermal concentrated solar power). During operation of the concentrator, a pressure difference is formed in the air-filled hollow spaces 4, 5, whereby the reflector film 6 is curved evenly concavely, so that the coupled-in solar radiation is focused in the absorber 1' by the reflecting surface 6'. In the state, in which the hollow spaces 4, 5 are filled with compressed air, the concentrator cushion 2 is on principle designed in a self-supporting manner, so that a significantly lower weight can be realized as compared to common solar concentrators. As is known in the prior art, the concentrator cushion 2 is made up of individual thin-walled (plastic) films; a transparent film is provided for the entry window 3.

As can further be seen from FIGS. 1A to 1C, a pivoting apparatus 7 for pivoting the concentrator cushion 2 is provided. The pivoting apparatus 7 has a plurality of pivoting elements in the form of pivoting rings 8, which surround the concentrator cushion 2 in its circumferential direction. Together, the pivoting rings 8 of the pivoting apparatus 7 form a tracking system, so that the concentrator cushion 2 can track the sun's path during operation. For this purpose, the pivoting apparatus 7 is set up to support the concentrator cushion 2 so as to be pivotable about at least one axis of the concentrator cushion 2, here specifically the longitudinal axis of the concentrator cushion 2.

As can further be seen from FIGS. 1A, 1B, 1C, and 2, provision is furthermore made for an anchoring apparatus 9 for the pivoting apparatus 7, wherein, in the shown embodiment, the anchoring apparatus 9 has a suspension apparatus 10 for suspending the pivoting rings 8 of the pivoting apparatus 7. The suspension apparatus 10 has a plurality of support frames 11, which are arranged so as to be spaced apart in the longitudinal direction of the concentrator cushion 2 and which have securing locations for the pivoting rings 8 of the pivoting apparatus 7. The securing locations are arranged above a plane 7' (see FIG. 2), which has the center of mass, of the pivoting rings 8. Each support frame 11 has a first frame element 12 on the one longitudinal side of the concentrator cushion 2, and a second frame element 13 on the other longitudinal side of the concentrator cushion 2. In addition, the support frame 11 has a third frame element 14 above the pivoting apparatus 7 comprising the concentrator cushion 2. The first frame element 12 on the one longitudinal side of the concentrator cushion 2 is connected to the second frame element 13 on the other longitudinal side of the concentrator cushion 2 via the third frame element 14. According to this, the support frame 11 extends in a curved manner from the one longitudinal side of the concentrator cushion 2 over the concentrator cushion 2 to the other longitudinal side of the concentrator cushion 2.

As can further be seen from FIGS. 1A, 1B, 1C, and 2, the first frame element 12 and the second frame element 13 in each case consist of a first straight or linear frame part 12a, 13a, respectively, and of a second straight or linear frame part 12b, 13b, respectively. The first frame part 12a, 13a is arranged substantially vertically in the operating state, wherein the lower end of the first frame part 12a, 13a is assembled in a base element 27. The second frame part 12b, 13b is angled inwardly from the upper end of the first frame part 12a, 13a towards the concentrator cushion 2.

As can further be seen from FIGS. 1A, 1B, 1C, and 2, the first frame element 12, the second frame element 13, and the third frame element 14 are embodied as elongated profile elements, which, in the shown embodiment, have an I-shaped cross section. The frame elements 12, 13, 14 are arranged in a plane substantially vertically to the longitudinal direction of the concentrator cushion 2.

As can further be seen from FIGS. 1A to 1C, the suspension apparatus 10 has a plurality of, in the shown embodiment three, support frames 11, which are connected to one another via a plurality of tension elements 15 in the form of rope elements. The number of the support frames 11 depends on the length of the concentrator cushion 2. The support frames 11 in each case support a pivoting ring 8, which surrounds the concentrator cushion 2. In the shown embodiment, the first frame elements 12 of the support frames 11 are clamped (braced) with one another on the one longitudinal side of the concentrator cushion 2 via tension elements 15 on the one hand, on the other hand, provision is made for tension elements 15 between the second frame elements 13 of the support frames 11 on the other longitudinal side of the concentrator cushion 2. In the shown embodiment, two tension elements 15 are clamped crosswise between the support frames 11 on both longitudinal sides. The front support frame 11' and the rear support frame 11", in each case based on the longitudinal direction of the concentrator cushion 2, are clamped on both longitudinal sides of the concentrator cushion 2 on bottom elements 17 via further tension elements 16. In the shown embodiment, the further tension elements 16 are formed by end areas of tension elements 15 between the support frames 11.

As can be seen from FIG. 2, pivot bearing apparatuses 18 in the form of roller bearings 19, 20 are provided between the suspension apparatus 10 and the pivoting rings 8 of the pivoting apparatus 7. In the shown embodiment, a first roller bearing 19 is provided on the first frame element 12 of the suspension apparatus 10 and a second roller bearing 20 is provided on the second frame element 13 of the suspension apparatus 10.

Figure 3:
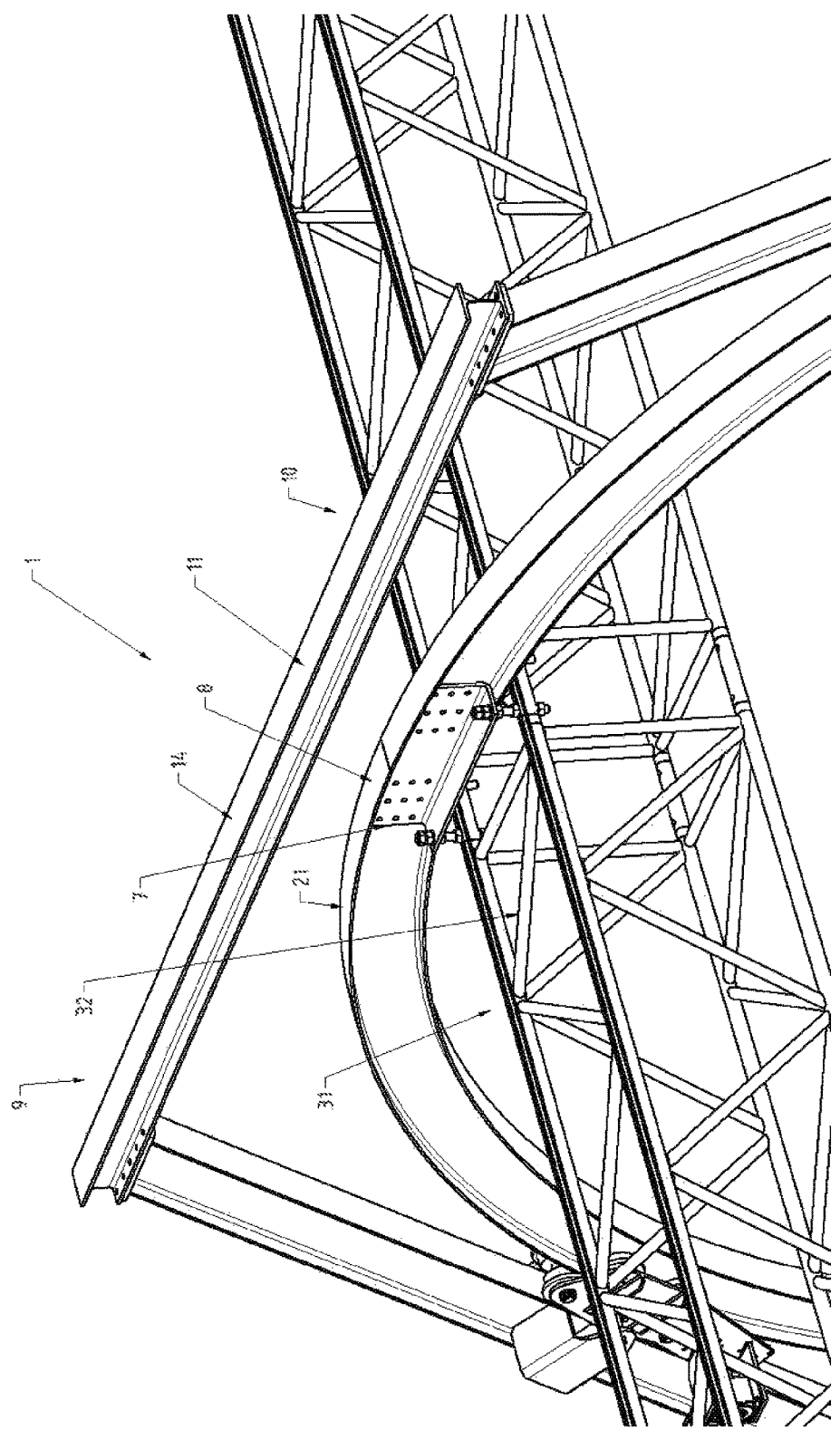
FIG. 3 shows a figurative detailed view of a section of the device according to FIGS. 1A, 1B, 1C, and 2, wherein the securing of an upper longitudinal member, which supports the concentrator cushion, can be seen on the pivoting ring.
Figure 4B:
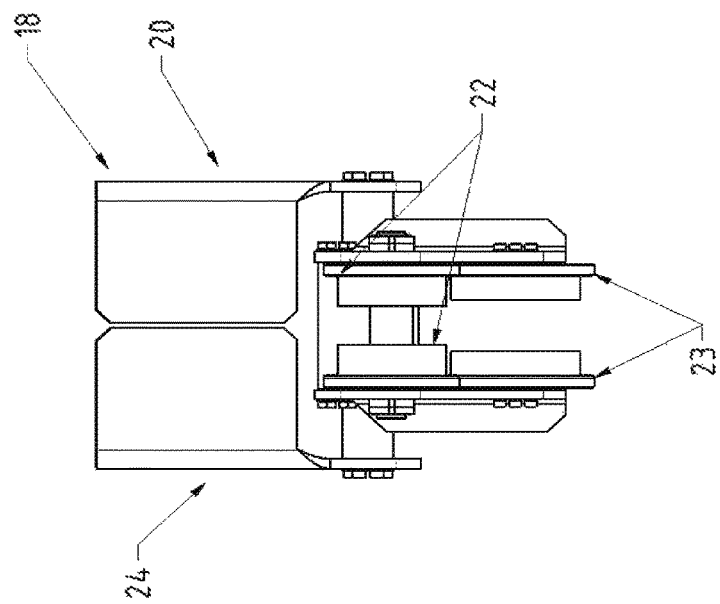
FIG. 4A and FIG. 4B in each case show a figurative view of a pivot bearing apparatus for pivoting the pivoting apparatus.
Figure 4A:
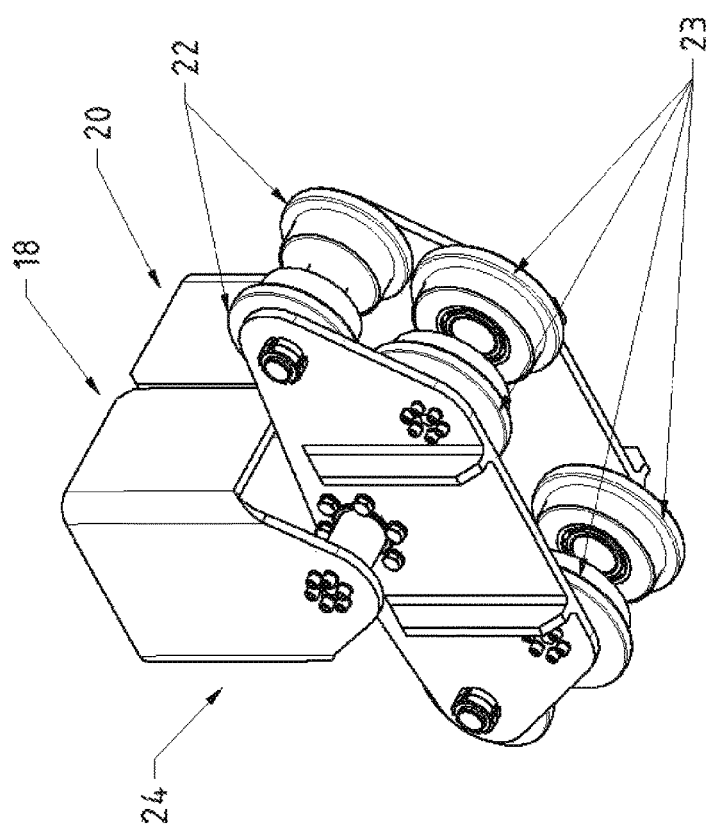

As can be seen from FIG. 3, the pivoting rings 8 in each case have a guide element 21 for the roller bearings 19, 20, wherein outer roller elements 22 roll on the top side of the guide element 21 and inner roller elements 23 roll on the inner side of the guide element 21. The roller elements 22, 23 of the roller bearings 19, 20 are assembled on travelling cranes 24, which are secured to the bottom side of the pivoting ring 8. In the shown embodiment, the pivoting rings 8 in each case have an I-shaped cross section, wherein upper flanges 25 of the I-shaped pivoting rings 8 are embodied as guide elements 21 for the roller bearings 19, 20.

As can be seen from FIG. 1B, provision is made on the suspension apparatus 10 for a covering apparatus 26, which can be transferred between a protective position, which at least partially covers the concentrator cushion 2, and a stowage position, which arranges the concentrator cushion 2 so as to be substantially completely exposed. In the shown embodiment, a plurality of covering apparatuses 26 are in each case secured between two adjacent support frames 11 on the first frame elements 12 on the one longitudinal side of the concentrator cushion 2 or on the first frame elements 13, respectively, on the other longitudinal side of the concentrator cushion 2. In the shown embodiment, the covering apparatuses 26 consist of a plurality of slat elements, which are connected to one another, and which can be transferred between a pushed-together position and a pulled-apart position. In the illustration of FIG. 1B, the two front covering apparatuses 26 are arranged in the pushed-together position, in which wind forces can act on the lower half of the concentrator cushion 2. In contrast, the two rear covering apparatuses 26 are arranged in the pulled-apart position, in which wind forces can be kept away from the lower area of the concentrator cushion 2. The covering apparatuses 26 can be transferred between the stowage position and the protective position in a motor-driven manner or manually.

As can be seen from FIGS. 1A, 1B, 1C, and 3, the device 1 also has a retaining apparatus 31 for the concentrator cushion 2, which (in each case based on the operating position) has an upper longitudinal member 32 and a lower longitudinal member 33. The upper longitudinal member 32 supports the absorber 1' (see FIG. 2), whereas the lower longitudinal member 33 contributes to the discharge of external loads. Both longitudinal members 32, 33 extend in the longitudinal direction of the concentrator cushion 2 between a front end piece 2' and a rear end piece 2" on the front sides of the concentrator cushion 2 (see FIG. 1C).

As can further be seen from the drawing, the upper longitudinal member 32 is suspended to the inner side on the upper area of the pivoting rings 8. The lower longitudinal member 33 is also attached on the inner side, but in the lower area of the pivoting rings 8. The upper longitudinal member 32 is connected to a top side of the concentrator cushion 2, the top side facing the solar radiation. The lower longitudinal member 33 is connected to a bottom side of the concentrator cushion 2, the bottom side facing away from the solar radiation. In the shown embodiment, the longitudinal members 32, 33 are embodied as lattice trusses. As can be seen from FIG. 2, the longitudinal members are arranged on a plane 7", which has the center point of the pivoting ring 8.

Figure 5:
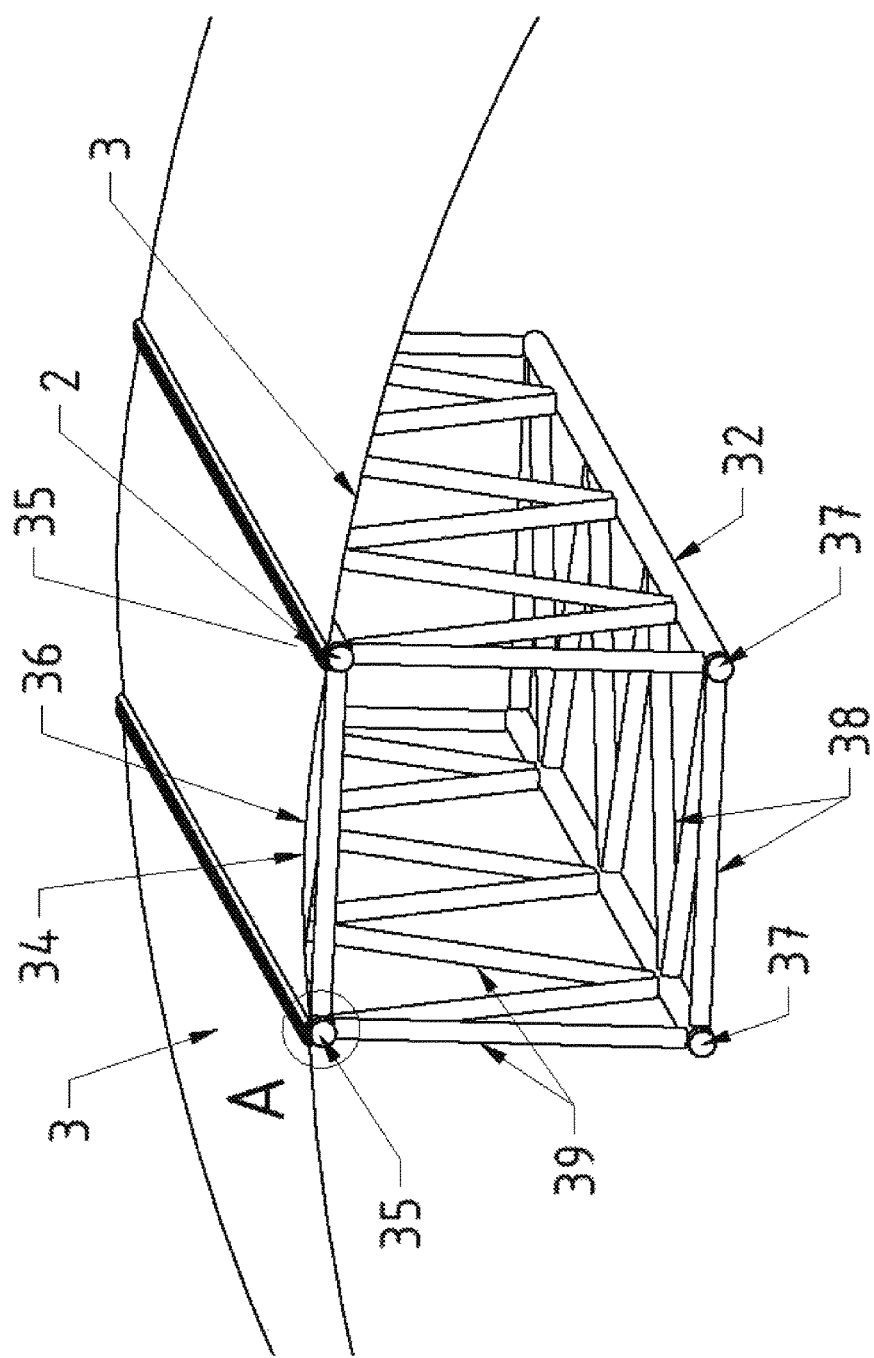
FIG. 5 shows a figurative detailed view of a section of the device according to FIGS. 1A to 3, wherein the securing of the concentrator cushion to the upper longitudinal member can be seen.

As can be seen from FIG. 5, the upper longitudinal member 32 is arranged on an upper passage opening 34 of the concentrator cushion 2, which is closed in a substantially air-tight manner on all sides. For this purpose, the upper longitudinal member 32 has two longitudinal belts 35, which run in the longitudinal direction of the concentrator cushion 2 (i.e. in the direction of its longer extension) and which are in each case connected to longitudinal edges of the concentrator cushion 2 on both sides of the upper passage opening 34 of the cover film element 3" in a substantially air-tight manner. The upper longitudinal member 32 thus has substantially the same width as the passage opening 34 of the concentrator cushion 2, which extends in the longitudinal direction of the concentrator cushion 2 substantially across the entire length thereof. To prevent air from escaping from the upper hollow space 4 of the concentrator cushion, a sealing film strip 36, by means of which the upper passage opening 34 of the concentrator cushion 2 is closed, is arranged between the longitudinal belts 35. The sealing film strip 36 is made of a transparent plastic material, in particular of ethylene-tetrafluoroethylene (ETFE).

The lower longitudinal member 33 is arranged on a substantially air-tight closed lower passage opening 34' of the concentrator cushion 2 (see FIG. 1B), wherein the lower passage opening 34' extends on a bottom film element 3' of the concentrator cushion 2, which bottom film element adjoins the lower hollow space 5. The upper 34 and the lower passage openings 34' have the same longitudinal extension as the upper longitudinal member 32 or the lower longitudinal member 33, respectively. The lower longitudinal member 33 is thereby embodied substantially identically as the upper longitudinal member 32. The connection between the lower longitudinal member 33 and the bottom film element 3' is furthermore designed in accordance with the connection between the upper longitudinal member 33 and the cover film element 3". The below embodiments relating to the upper longitudinal member 32 are to thus be understood accordingly for the lower longitudinal member 33.

As can further be seen from FIG. 5, the upper longitudinal member 32 has two further longitudinal belts 37, which extend parallel to the longitudinal belts 35 in the longitudinal direction of the concentrator cushion 2. The further longitudinal belts 37 of the upper longitudinal member 32 are arranged inside the upper hollow space of the concentrator cushion 2. The longitudinal belts 35 and the further longitudinal belts 37 of the upper longitudinal member 32 are connected to one another via filling bars by forming intermediate spaces. Further filling bars 39 are provided between the longitudinal belts 35 and the further longitudinal belts 37.

As can be seen in detail from FIGS. 6A and 6B, profile elements 40 are arranged on the longitudinal belts 35 of the upper longitudinal member 32. On the one side, each profile element 40 is connected to a connecting element 41 for the substantially air-tight connection to the adjacent longitudinal edge of the cover film element 3", and, on the other side, to a further connecting element 42 for the substantially air-tight connection to the adjacent longitudinal edge of the sealing film strip 36. FIG. 6B shows an embodiment, in the case of which the profile element 40 is attached as independent component to the top side of the longitudinal belt 35. According to FIG. 6b, the profile element 40 is formed in one piece with the longitudinal belt 35 of the upper longitudinal member 32.

As can be seen from FIGS. 6A and 6B, provision is made in the case of this embodiment on the longitudinal belts 35 of the upper longitudinal member 32 for retaining elements 40' for the positive connection to corresponding retaining elements (not shown) on the pivoting apparatus 7, in order to suspend the upper longitudinal member 32 on the pivoting apparatus 7. In the shown embodiment, the profile element 40 has retaining openings 40", in which the corresponding retaining elements for the connection of the pivoting apparatus are received, for forming the retaining elements 40' in the longitudinal direction of the concentrator cushion 2.

In the embodiment alternatives of FIGS. 5, 6A, and 6B, provision is made as connecting element 41 for a keder rail 43, in which a keder element 44 is received so as to form a seal on the corresponding longitudinal edge of the cover film element 3". As further connecting element 42, provision is accordingly made for a further keder rail 45, in which a further keder element 46 is received so as to form a seal on the corresponding longitudinal edge of the sealing film strip 36.

Figure 7A:
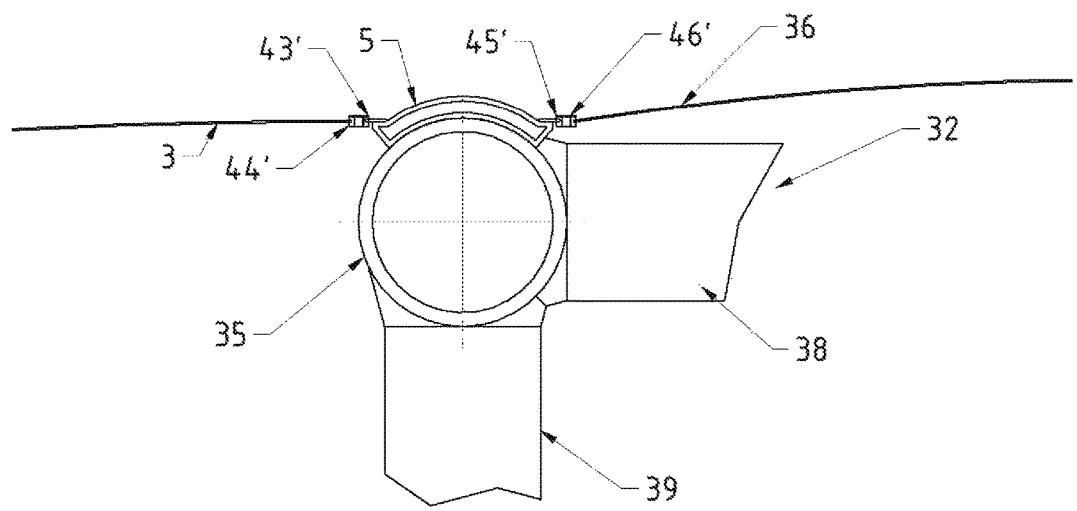
FIG. 7A and FIG. 7B in each case show a section of an alternative embodiment according to the invention of the device, in the case of which an air-tight zipper for connecting the concentrator cushion to the upper longitudinal member is provided.
Figure 7B:
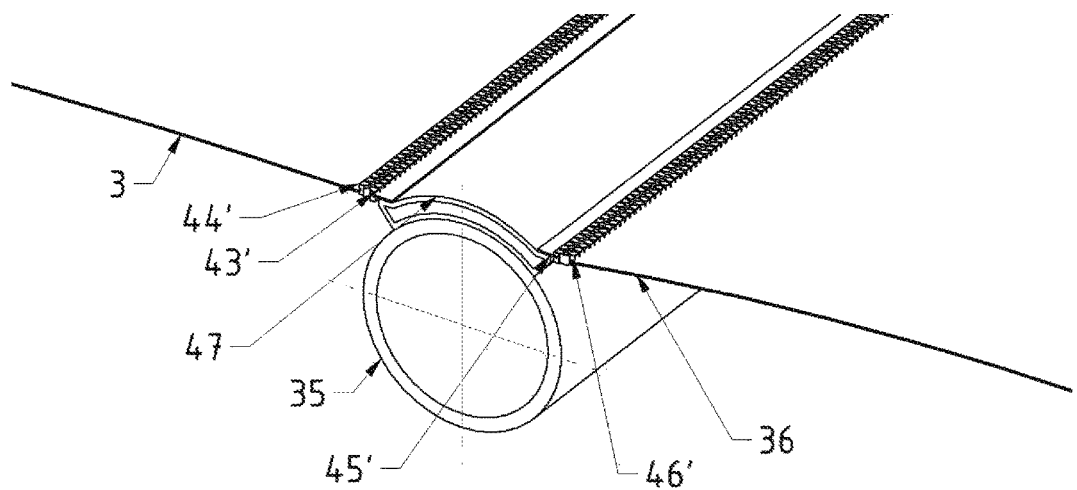

FIGS. 7A, 7B show an alternative embodiment of the connection between the upper longitudinal member 32 and the cover film element 3". In the case of this embodiment, provision is made as connecting element 41 for a zipper element 43' for the connection to a corresponding zipper element 44' on one of the longitudinal edges of the cover film element 3". As further reconnecting element 42, provision is accordingly made for a further zipper element 45' for the connection to a corresponding further zipper element 46' of the sealing film strip 36. The zipper elements 43', 45' are arranged on the top side of a profile 47, which extends in the longitudinal direction of the concentrator cushion 2 and which is arranged on the top side on the longitudinal belt 35 of the upper longitudinal member 32.

Figure 8A:
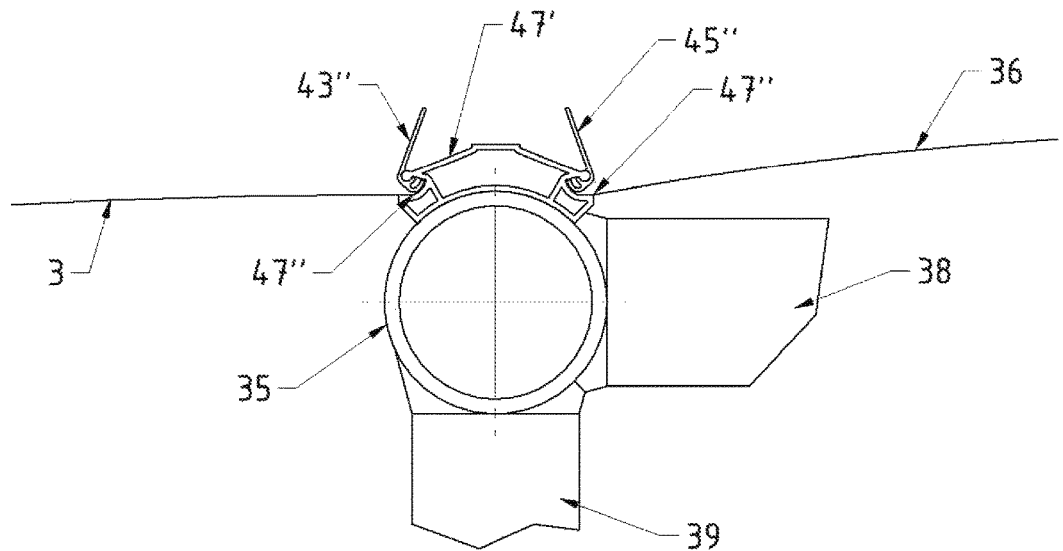
FIG. 8A and FIG. 8B in each case show a section of a further alternative embodiment according to the invention of the device, in the case of which the longitudinal edges of the concentrator cushion can be clamped to the upper longitudinal belts of the longitudinal member, wherein the released position is illustrated in FIG. 8A and the clamped position is illustrated in FIG. 8B.
Figure 8B:
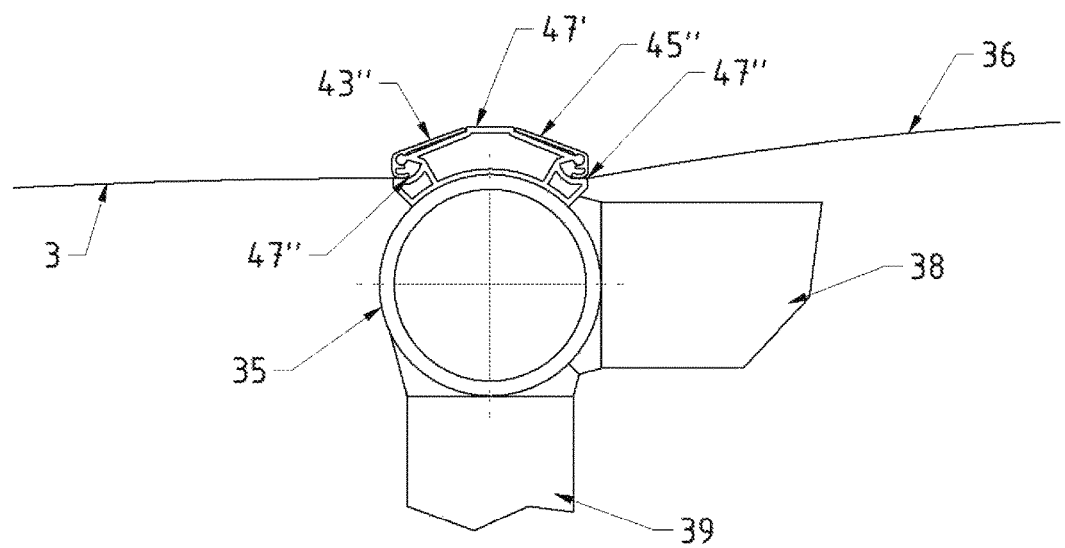

FIGS. 8A, and 8B shows a further alternative embodiment, in the case of which provision is made as connecting element 41 for a clamping part 43" for clamping the corresponding longitudinal edge of the cover film element 3". Provision is accordingly made as further connecting element 42 for a further clamping part 45" for clamping the corresponding longitudinal edge of the sealing film strip 36. For this purpose, provision is made on the top side of the longitudinal belt 35 for a profile part 47', which extends in the longitudinal direction of the concentrator cushion 2. The profile part 47' has bearing surfaces 47", which cooperate with the clamping part 43" or the further clamping part 45", respectively. The clamping part 43" can be pivoted between a position, which releases the longitudinal edge of the cover film element 3" (see FIG. 8A) and a position, which clamps the longitudinal edge of the cover film element 3" (see FIG. 8B). The further clamping part 45" can accordingly be pivoted between a position, which releases the longitudinal edge of the sealing film strip 36 (see FIG. 8A) and a position, which clamps the longitudinal edge of the sealing film strip 36 (see FIG. 8B).

Figure 9:
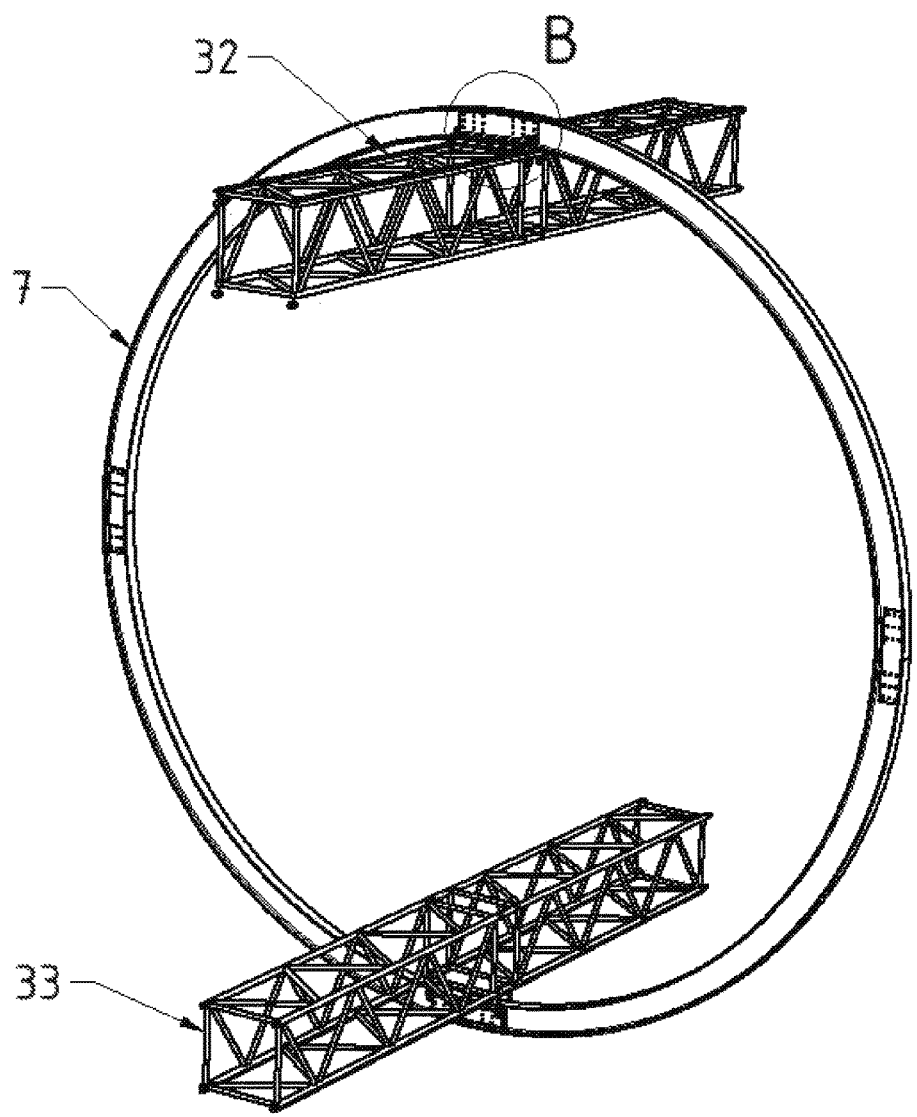
FIG. 9 shows an enlarged figurative view of one of the pivoting rings of the concentrator device according to FIGS. 1A to 3, wherein the longitudinal members are assembled on the pivoting ring so as to be height-adjustable.

As can be seen from FIG. 9, provision is made between the upper longitudinal member 32 of the retaining apparatus 31 and the pivoting apparatus 7 for an adjusting device 48, by means of which the distance between the upper longitudinal member 32 and the pivoting apparatus 7 can be adjusted. A further adjusting device is provided between the lower longitudinal member 32 and the pivoting apparatus 7, wherein the following explanations relating to the adjusting device 48 for the upper longitudinal member 32 are to refer analogously to the adjustment of the lower longitudinal member 33. The adjusting device 48 is connected to both longitudinal belts 35 of the upper longitudinal member 32 on the one hand and to a horizontal securing flange 49 on the other hand.

Figure 10A:
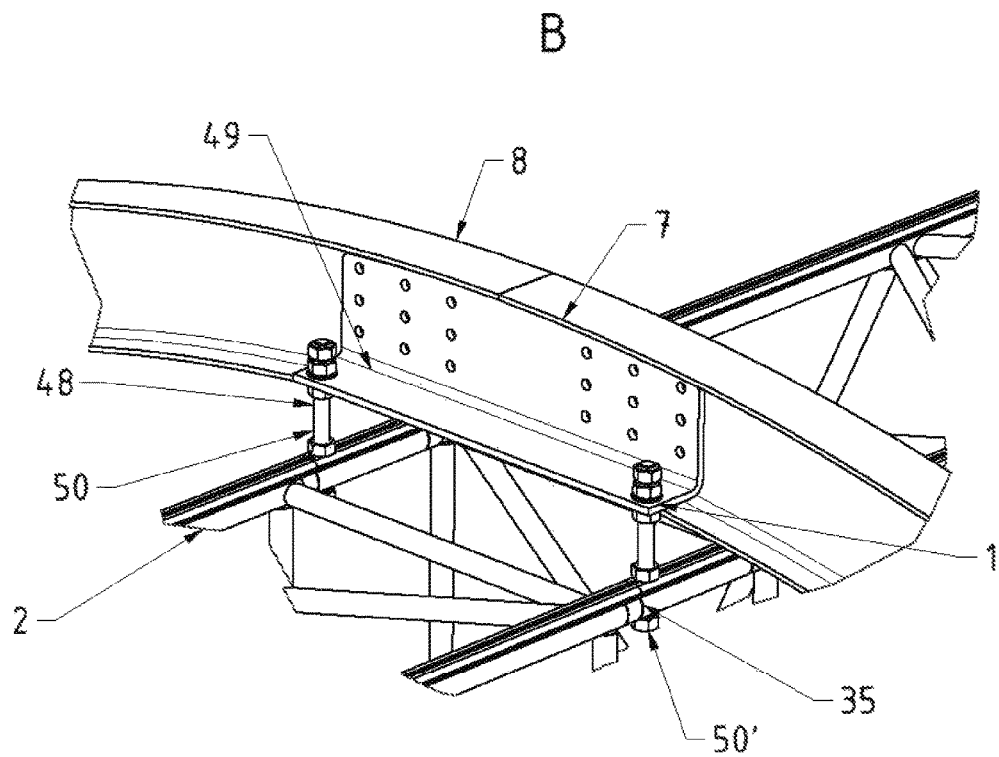
FIG. 10A shows an enlarged illustration of detail B, which is illustrated in FIG. 9 by means of a circle, wherein the adjusting device is adjusted to a larger distance between the upper longitudinal member and the pivoting ring by means of a threaded rod.
Figure 10B:
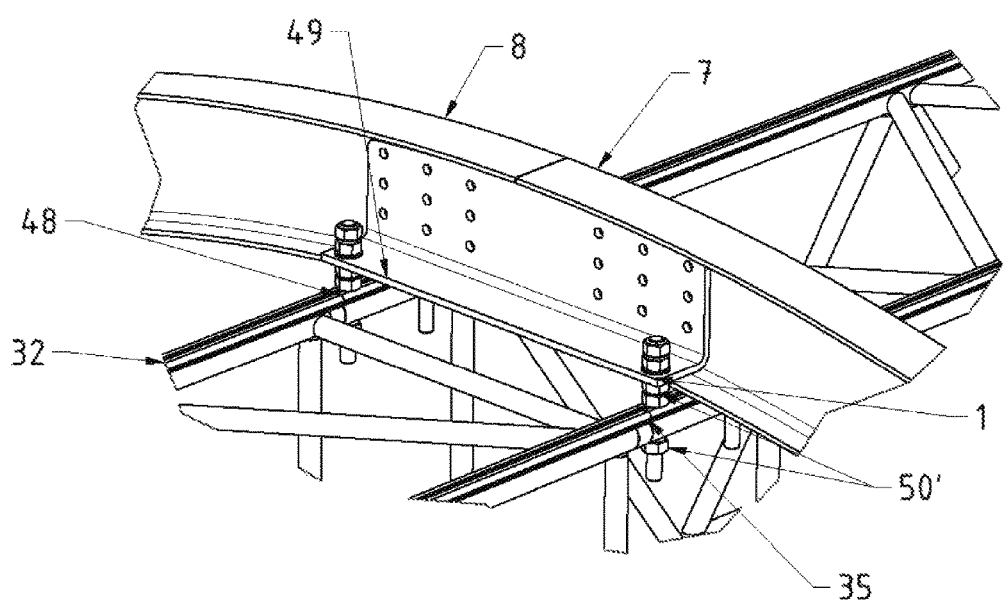
FIG. 10B shows a detailed view according to FIG. 10A, wherein the longitudinal member was guided closer to the pivoting ring by adjusting the threaded rod.
Figure 11A:
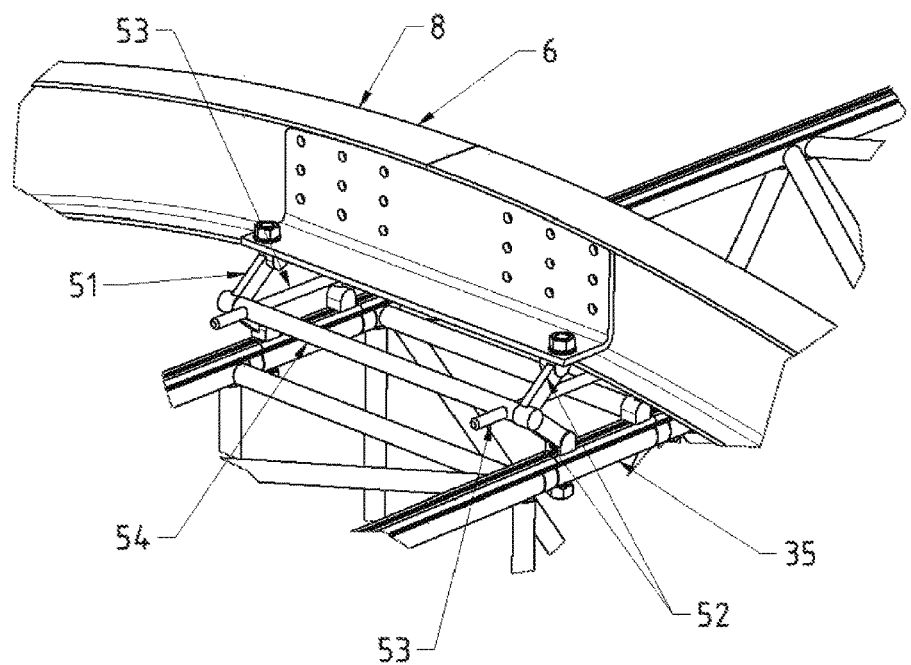
FIGS. 11A to 11D shows detailed views of an alternative embodiment of the adjusting device, in the case of which toggle lever elements are provided between the pivoting ring and the upper longitudinal member for adjusting the distance, wherein the toggle lever elements in FIGS. 11A, 11C are adjusted to a larger distance between the pivoting ring and the upper longitudinal member than in FIGS. 11B, 11D.
Figure 11B:
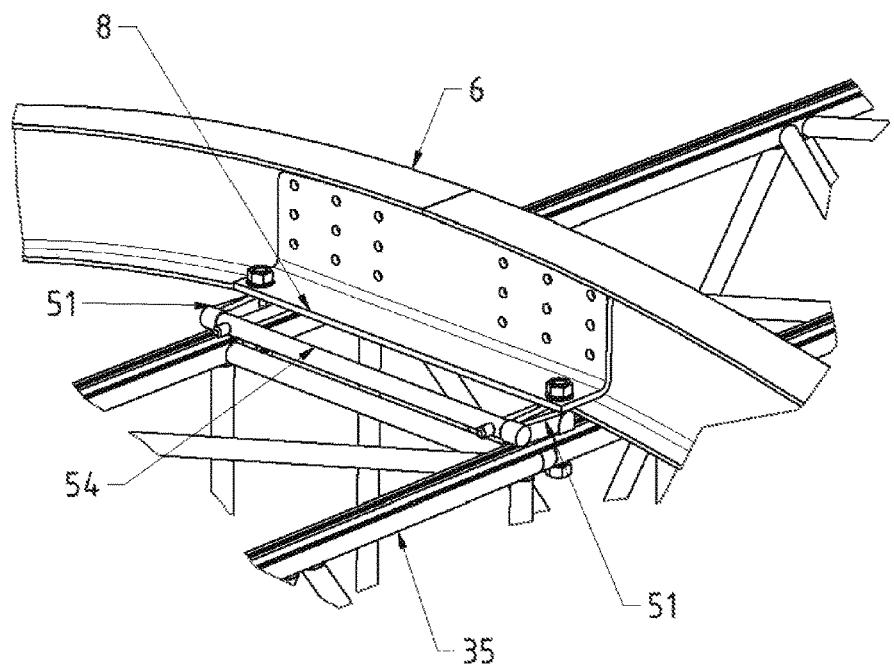
Figure 11C:
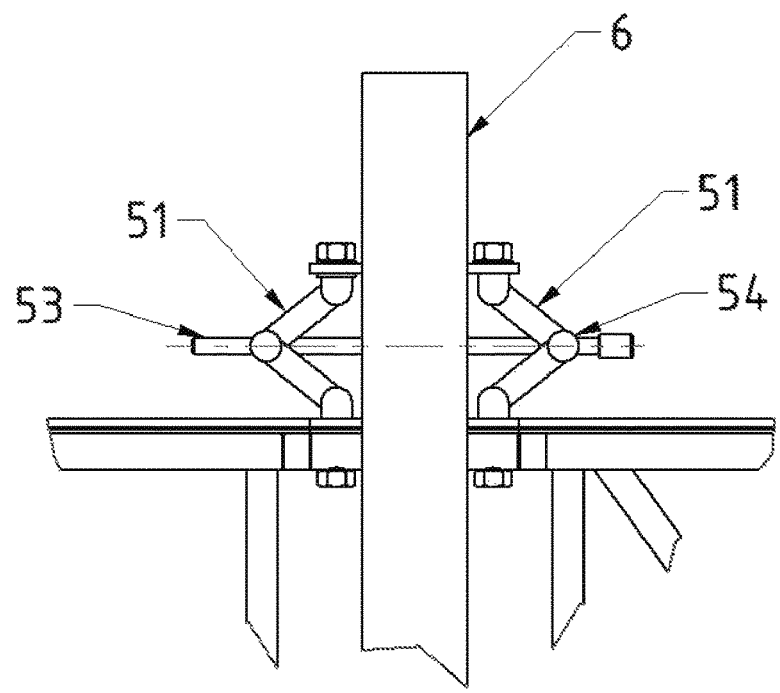
Figure 11D:
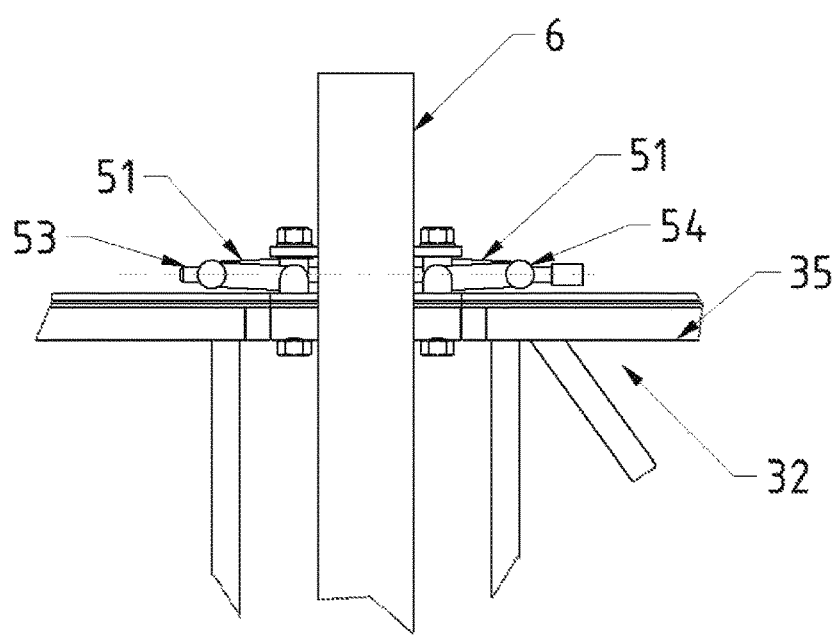
Figure 12A:
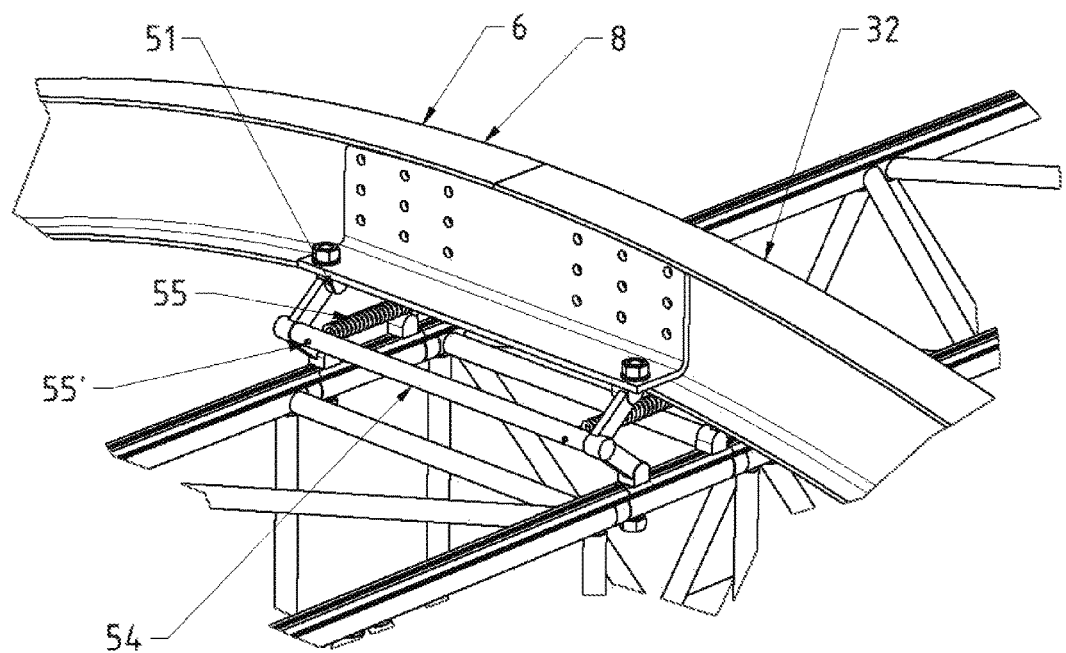
FIGS. 12A to 12D show detailed views of an alternative embodiment of the adjusting device, in the case of which the toggle lever elements can automatically track the matching distance between the pivoting ring and the upper longitudinal member against the force of a spring element, wherein the toggle lever elements in FIGS. 12A, 12C are adjusted to a larger distance between the pivoting ring and the upper longitudinal member than in FIGS. 12B, 12D.
Figure 12B:
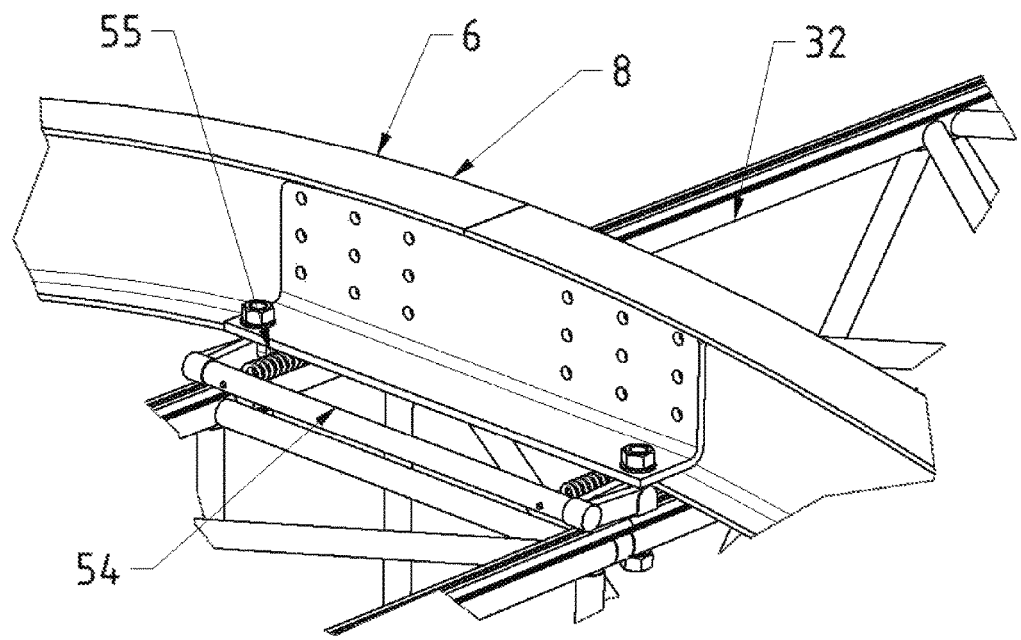
Figure 12C:
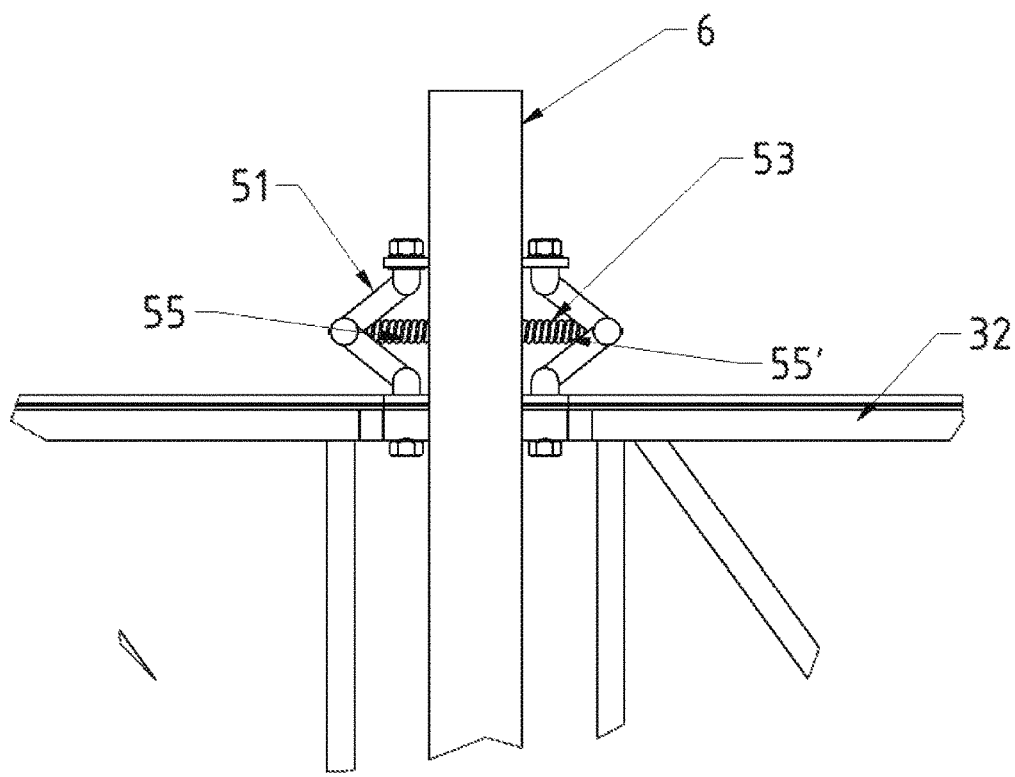
Figure 12D:
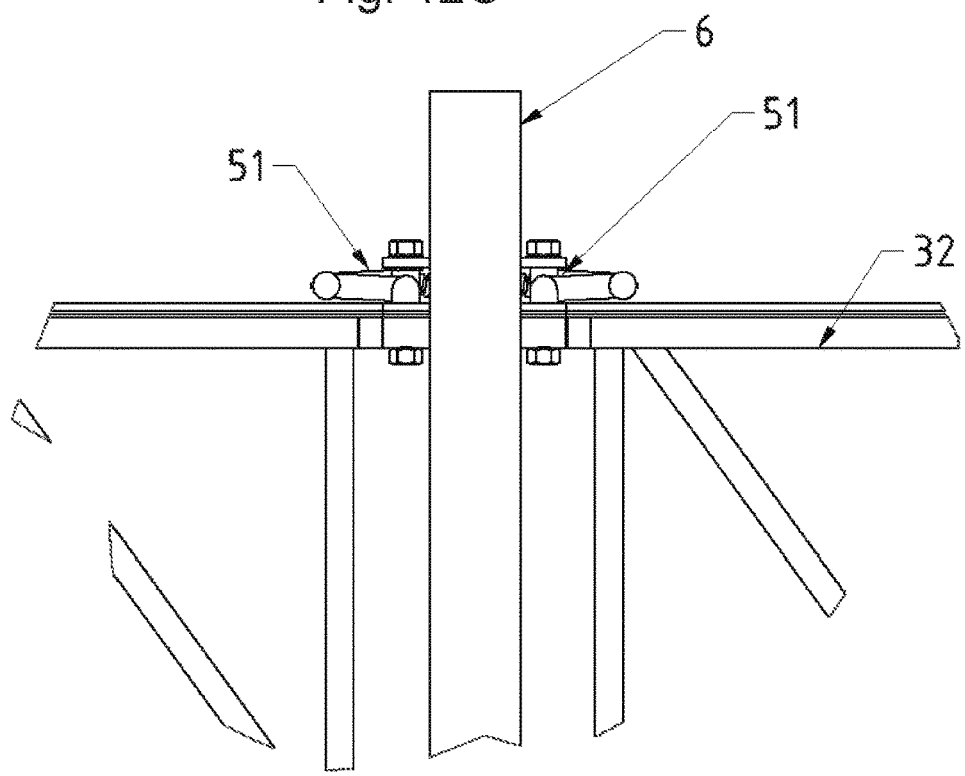

According to FIGS. 10A, and 10B, the adjusting device 48 has an adjusting element in the form of a threaded rod 50, which cooperates with threaded nuts 50' in order to be able to manually adjust the distance between the upper longitudinal member 32 and the pivoting apparatus 7. In the embodiment of FIGS. 10A, and 10B, the threaded rod 50 is arranged substantially vertically to the longitudinal direction of the upper longitudinal member 32. The longitudinal belts 35 of the upper longitudinal member 32 are in each case connected to at least one threaded rod 50.

According to FIGS. 11A to 11D, a plurality of toggle lever elements 51, which, on their ends, have leg parts 52, which are connected to one another in an articulated manner, is arranged between the upper longitudinal member 32 and the pivoting apparatus 7. To adjust the distance between the pivoting apparatus 7 and the upper longitudinal member 32, the opening angle between the leg parts 52 of the toggle lever elements 51 is adapted. In the shown embodiment, two toggle lever elements 51, which are spaced apart from one another in the longitudinal direction and which are coupled to one another via at least one adjusting element 53 in the form of a threaded rod, are in each case secured to both longitudinal belts 35. By adjusting the threaded rod, the opening angle of the toggle lever elements 51 and thus the distance between the pivoting apparatus 7 and the upper longitudinal member 32 can be adjusted. In the shown embodiment, two adjusting elements 53 are horizontally arranged substantially parallel to the longitudinal direction of the upper longitudinal member 32.

As can further be seen from FIGS. 11A to 11D, the toggle lever elements 53 are connected to one another in pairs via connecting rods 54 on the opposite longitudinal belts 35 of the upper longitudinal member 32. In the shown embodiment, provision is made for two adjusting elements 53 in the form of threaded rods, which are connected to the connecting rods 54 so as to be capable of being adjusted.

According to FIGS. 12A to 12D, the adjusting device 48 has a drive element 55, by means of which the distance between the pivoting apparatus 7 and the upper longitudinal member 32 can be automatically readjusted as a function of a load state of the upper longitudinal member 32 (i.e. in particular as a function of a vertical force as a result of the creeping of the concentrator cushion 2). As drive element 55, provision is made for a spring element 55' in such a way that the upper longitudinal member 32 is guided closer to the pivoting ring 8 against the force of the spring element 55', depending on the load state of the upper longitudinal member 32. In the shown embodiment, the adjusting elements 53 are embodied as drive elements 55 between the connecting rods 54.

The invention claimed is:

1. A device for concentration of solar radiation in an absorber, comprising an inflatable concentrator cushion, which comprises a cover film element comprising a light-permeable entry window for coupling in solar radiation and a reflector film, which sub-divides the concentrator cushion into at least two hollow spaces, for the concentration of solar radiation in an absorber, comprising a pivoting apparatus, by which the concentrator cushion is pivotable, and comprising a retaining apparatus assembled on the pivoting apparatus, for retaining the concentrator cushion, the retaining apparatus comprises an upper longitudinal member, which extends in a longitudinal direction of the concentrator cushion for suspending the absorber, wherein the upper longitudinal member is arranged on a substantially air-tight closed upper passage opening of the concentrator cushion, wherein an adjusting device is provided between the upper longitudinal member of the retaining apparatus and the pivoting apparatus, by which the distance between the upper longitudinal member and the pivoting apparatus is adjustable.

2. The device according to claim 1, wherein the upper longitudinal member comprises at least two longitudinal belts, which extend in the longitudinal direction of the concentrator cushion and which are in particular connected to one another via filling bars, the longitudinal belts are in each case connected to a longitudinal edge of the cover film element, the longitudinal edge delimits the upper passage opening, wherein the adjusting device is connected to one of the longitudinal belts of the upper longitudinal member.

3. The device according to claim 2, wherein the adjusting device for adjusting the distance between the upper longitudinal member and the pivoting apparatus comprises an adjusting element, in particular a threaded rod, which is in particular arranged substantially vertically to the longitudinal direction of the upper longitudinal member.

4. The device according to claim 1, wherein at least one toggle lever element comprising two leg parts, which are connected to one another in an articulated manner, is arranged between the upper longitudinal member and the pivoting apparatus, wherein an opening angle between the leg parts of the toggle lever element for adjusting the distance between the pivoting apparatus and the upper longitudinal member is changed.

5. The device according to claim 4, wherein, for changing the opening angle, the at least one toggle lever element is coupled to an adjusting element.

6. The device according to claim 5, wherein two toggle lever elements, which are arranged on the longitudinal belts of the upper longitudinal member, are connected to one another via a connecting rod.

7. The device according to claim 6, wherein the two toggle lever elements, which are spaced apart in the longitudinal direction of the upper longitudinal member are secured to each longitudinal belt.

8. The device according to claim 7, wherein the two toggle lever elements are coupled to one another via the adjusting element.

9. The device according to claim 5, wherein the adjusting element is arranged substantially parallel to the longitudinal direction of the upper longitudinal member.

10. The device according to claim 1, wherein the adjusting device comprises a drive element, by which the distance between the pivoting apparatus and the upper longitudinal member is automatically readjustable as a function of a load state of the upper longitudinal member.

11. The device according to claim 10, wherein provision is made for a spring element as the drive element, wherein the distance between the pivoting apparatus and the upper longitudinal member is adjustable as a function of the load state of the upper longitudinal member against the force of the spring element.

12. The device according to claim 1, wherein the pivoting apparatus comprises at least one pivoting element, comprising a pivoting ring, which surrounds the concentrator cushion in its circumferential direction, wherein the upper longitudinal member of the retaining apparatus is suspended on the pivoting element by the adjusting device.

13. The device according to claim 12, wherein provision is made for a plurality of pivoting elements, comprising pivoting rings, which are spaced apart in the longitudinal direction of the concentrator cushion and to which the upper longitudinal member of the retaining apparatus for the absorber is suspended, wherein provision is made in each case between the upper longitudinal member and the pivoting elements, the pivoting rings, for an adjusting device.

14. The device according to claim 1, wherein a lower longitudinal member of the retaining apparatus is arranged on a substantially air-tight closed lower passage opening of the concentrator cushion, wherein provision is made between the lower longitudinal member of the retaining apparatus and the pivoting apparatus for a further adjusting device for adjusting the distance between the lower longitudinal member and the pivoting apparatus.

15. The device according to claim 1, wherein, for anchoring the pivoting apparatus on a bottom structure, provision is made for an anchoring apparatus, which comprises a suspension apparatus for suspending the pivoting apparatus.

16. The device according to claim 15, wherein provision is made between the suspension apparatus and the pivoting apparatus for a pivot bearing apparatus, comprising a roller bearing.

17. The device according to claim 15, wherein the anchoring apparatus comprises a suspension apparatus for suspending the pivoting apparatus.

18. The device according to claim 1, wherein the concentrator cushion is pivoted about its longitudinal axis.

* * * * *